US008999823B2

(12) United States Patent
Makita et al.

(10) Patent No.: US 8,999,823 B2
(45) Date of Patent: Apr. 7, 2015

(54) SEMICONDUCTOR DEVICE, METHOD FOR MANUFACTURING SAME, AND DISPLAY DEVICE

(75) Inventors: Naoki Makita, Osaka (JP); Hiroshi Nakatsuji, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 909 days.

(21) Appl. No.: 13/125,865

(22) PCT Filed: Oct. 20, 2009

(86) PCT No.: PCT/JP2009/005478
§ 371 (c)(1),
(2), (4) Date: Apr. 25, 2011

(87) PCT Pub. No.: WO2010/047086
PCT Pub. Date: Apr. 29, 2010

(65) Prior Publication Data
US 2011/0261019 A1      Oct. 27, 2011

(30) Foreign Application Priority Data

Oct. 23, 2008   (JP) ................................ 2008-273525

(51) Int. Cl.
*H01L 27/12*      (2006.01)
*H01L 27/146*    (2006.01)
*G09G 5/10*      (2006.01)
(Continued)

(52) U.S. Cl.
CPC ............ *H01L 27/14665* (2013.01); *G09G 5/10* (2013.01); *G06F 3/042* (2013.01); *H01L 27/12* (2013.01); *H01L 27/1229* (2013.01); *H01L 29/78633* (2013.01)

(58) Field of Classification Search
CPC ......... H01L 27/12; H01L 21/20; G06F 3/042; G09G 5/10
USPC ............. 257/72; 438/155, 478, 482, 486, 487
See application file for complete search history.

(56) References Cited

U.S. PATENT DOCUMENTS 5,501,989 A * 3/1996 Takayama et al. ............ 438/155
2003/0160239 A1 * 8/2003 Shinagawa et al. ............. 257/64
(Continued)

FOREIGN PATENT DOCUMENTS

JP      63-27066       2/1988
JP      6-275807       9/1994
(Continued)

OTHER PUBLICATIONS

English Translation of the International Preliminary Report in Application No. PCT/JP2009/005478, dated May 26, 2011.
(Continued)

*Primary Examiner* — Colleen A Matthews
*Assistant Examiner* — William Harriston
(74) *Attorney, Agent, or Firm* — Nixon & Vanderhye P.C.

(57) ABSTRACT

A semiconductor device according to the present invention includes a thin-film transistor and a thin-film diode. The respective semiconductor layers and of the thin-film transistor and the thin-film diode are crystalline semiconductor layers that have been formed by crystallizing the same crystalline semiconductor film. Ridges have been formed on the surface of the semiconductor layer of the thin-film diode. And the semiconductor layer of the thin-film diode has a greater surface roughness than the semiconductor layer of the thin-film transistor.

20 Claims, 12 Drawing Sheets

(51) Int. Cl.
*G06F 3/042* (2006.01)
*H01L 29/786* (2006.01)

(56) References Cited

U.S. PATENT DOCUMENTS

| | | | |
|---|---|---|---|
| 2004/0207001 A1* | 10/2004 | Kouznetsov et al. | 257/314 |
| 2005/0032249 A1 | 2/2005 | Im et al. | |
| 2005/0045881 A1* | 3/2005 | Nakamura et al. | 257/59 |
| 2007/0262311 A1* | 11/2007 | Liu et al. | 257/66 |
| 2008/0142808 A1* | 6/2008 | Lee | 257/72 |
| 2009/0050891 A1 | 2/2009 | Katoh | |
| 2009/0146927 A1* | 6/2009 | Wan et al. | 345/76 |
| 2010/0065851 A1* | 3/2010 | Makita | 257/72 |

FOREIGN PATENT DOCUMENTS

| | | |
|---|---|---|
| JP | 6-275808 | 9/1994 |
| JP | 2003-249639 | 9/2003 |
| JP | 2005-072126 | 3/2005 |
| JP | 2005-347560 | 12/2005 |
| JP | 2006-003857 | 1/2006 |
| JP | 2007-288159 | 11/2007 |
| WO | WO 2006/129428 | 12/2006 |

OTHER PUBLICATIONS

International Search Report for PCT/JP2009/005478, mailed Dec. 22, 2009.

* cited by examiner

SEMICONDUCTOR DEVICE, METHOD FOR MANUFACTURING SAME, AND DISPLAY DEVICE

This application is the U.S. national phase of International Application No. PCT/JP2009/005478, filed 20 Oct. 2009, which designated the U.S. and claims priority to JP Application No. 2008-273525, filed 23 Oct. 2008, the entire contents of each of which are hereby incorporated by reference.

TECHNICAL FIELD

The present invention relates to a semiconductor device including a thin-film transistor (TFT) and a thin-film diode (TFD) and a method for fabricating such a device, and also relates to a display device.

BACKGROUND ART

Recently, a semiconductor device including a thin-film transistor (TFT) and a thin-film diode (TFD) on the same substrate and electronic devices with such a semiconductor device have been developed. It was proposed that such a semiconductor device be fabricated by making the respective semiconductor layers of the TFT and TFD of the same crystalline semiconductor film on the substrate.

Patent Document No. 1 discloses an image sensor including, on the same substrate, a photosensor unit that uses a TFD and a driver that uses a TFT. According to Patent Document No. 1, the respective semiconductor layers of the TFT and TFD are obtained by crystallizing an amorphous semiconductor film that has been deposited on a substrate.

If the TFT and TFD form integral parts of a single semiconductor device on the same substrate in this manner, not just the overall size of the semiconductor device but also the number of required parts can be reduced, thus cutting down the cost significantly. On top of that, products with new functions, which could not be achieved by conventional combinations of parts, can also be provided.

On the other hand, Patent Document No. 2 discloses a technique for using the same semiconductor film of amorphous silicon to form a TFT of crystalline silicon (which will be referred to herein as a "crystalline silicon TFT") and a TFD of amorphous silicon (which will be referred to herein as an "amorphous silicon TFD") on the same substrate. Specifically, a catalyst element that promotes the crystallization of amorphous silicon is added to only a portion of the amorphous silicon film on the substrate to be the active region of the TFT. After that, a heat treatment process is carried out, thereby obtaining a silicon film, of which only the portion to be the active region of the TFT has been crystallized but a portion to be the TFD remains amorphous. By using such a silicon film, the crystalline silicon TFT and the amorphous silicon TFD can be fabricated on the same substrate more easily.

Furthermore, according to Patent Document No. 3, the same semiconductor film (of amorphous silicon) is used to make a photosensor TFT functioning as a photosensor and a switching TFT functioning as a switching element. By making the silicon film that defines the channel region of the photosensor TFT thicker than the silicon film that defines the source and drain regions thereof or the active region of the switching TFT, the sensitivity of the photosensor is increased. According to that patent document, to make the thicknesses of the respective silicon films of those TFTs different from each other, when a photolithographic process is carried out to divide the amorphous silicon film into a number of islands, the amorphous silicon film has its thickness partially reduced by half exposure process that uses a gray tone mask. Patent Document No. 3 also discloses that by irradiating the amorphous silicon film with a laser beam, those thinned portions of the amorphous silicon film (i.e., portions to be the source and drain regions of each photosensor TFT and the portion to be the active region of each switching TFT) are crystallized but the other non-thinned portion (i.e., the portion to be the channel region of the photosensor TFT) is left amorphous.

CITATION LIST

Patent Literature

Patent Document No. 1: Japanese Patent Application. Laid-Open Publication No. 6-275808
Patent Document No. 2: Japanese Patent Application Laid-Open Publication No. 6-275807
Patent Document No. 3: Japanese Patent Application Laid-Open Publication No. 2005-72126

SUMMARY OF INVENTION

Technical Problem

According to Patent Document No. 1, the respective semiconductor layers of the TFT and the TFD are formed at the same time by crystallizing the same crystalline semiconductor film. The TFT and TFD are required to have different device characteristics according to their applications. According to such a method, however, it is difficult for both of the TFT and the TFD to meet their required device characteristics at the same time.

According to the methods disclosed in Patent Documents Nos. 2 and 3, TFT's and TFD's semiconductor layers with mutually different crystal states are formed out of the same amorphous semiconductor film. However, it is difficult to modify the manufacturing process so that the crystal states can be optimized on a semiconductor layer basis. On top of that, even if any of the methods disclosed in Patent Documents No. 2 and 3 is adopted, it is still hard to obtain a TFT and a TFD with good performances as will be described below.

If only a portion of the same amorphous semiconductor film is selectively crystallized as in Patent Document No. 2 to form a crystalline silicon TFT of the crystallized portion and an amorphous silicon TFD of the remaining amorphous portion of the film, it is certainly possible to improve the characteristics of the crystalline silicon TFT by controlling the crystal growing conditions. In that case, however, some of the hydrogen atoms originally included in the amorphous silicon film will be lost during the heat treatment process of crystallizing the portion of the amorphous silicon film into crystalline silicon. As a result, an amorphous silicon TFD with good electrical characteristics cannot be formed of such a portion that is left amorphous after the heat treatment process. Specifically, in an amorphous silicon film as deposited, silicon atoms are tightly bonded with hydrogen atoms, thus leaving no dangling bonds at all (i.e., terminating). However, during the annealing process to crystallize the amorphous silicon film, the bonds between the silicon and hydrogen atoms are broken, and some hydrogen atoms are lost, thus turning the amorphous silicon film into an amorphous silicon of poor quality with a lot of dangling bonds of silicon. For the same reason, it is also difficult to obtain a photosensor TFT (i.e., an amorphous silicon TFT) with good electrical characteristics by the method of Patent Document No. 3.

As can be seen, if a semiconductor device is fabricated by forming TFTs and TFDs of the same amorphous semiconductor film by any of those conventional techniques, it is difficult for the TFTs and TFDs to achieve their required performances at the same time. As a result, a high-performance semiconductor device could not be obtained.

It is therefore an object of the present invention to provide a semiconductor device that includes a thin-film transistor and a thin-film diode on the same substrate and that can have the thin-film transistor and thin-film diode achieve their expected performances.

Solution to Problem

A semiconductor device according to the present invention includes a thin-film transistor and a thin-film diode. The thin-film transistor includes a semiconductor layer that has a channel region, a source region and a drain region, a gate electrode that controls the conductivity of the channel region, and a gate insulating film arranged between the semiconductor layer and the gate electrode. The thin-film diode includes a semiconductor layer that has at least an n-type region and a p-type region. The respective semiconductor layers of the thin-film transistor and the thin-film diode are crystalline semiconductor layers that have been formed by crystallizing the same amorphous semiconductor film. Ridges have been formed on the surface of the semiconductor layer of the thin-film diode. And the semiconductor layer of the thin-film diode has a greater surface roughness than that of the thin-film transistor.

In one preferred embodiment, the respective semiconductor layers of the thin-film transistor and the thin-film diode have substantially equal degrees of crystallinity.

In another preferred embodiment, the respective semiconductor layers of the thin-film transistor and the thin-film diode have substantially the same average crystal grain size.

In still another preferred embodiment, the semiconductor layer of the thin-film diode has a greater arithmetic average surface roughness Ra than that of the thin-film transistor.

In yet another preferred embodiment, the semiconductor layer of the thin-film diode has a greater maximum surface height Rz than that of the thin-film transistor.

In yet another preferred embodiment, ridges have been formed on the surface of the semiconductor layer of the thin-film transistor, too. The ridges on the surface of the semiconductor layer of the thin-film transistor have a smaller average height than their counterparts on the surface of the semiconductor layer of the thin-film diode.

In yet another preferred embodiment, the semiconductor layer of the thin-film transistor has a substantially flat surface.

In yet another preferred embodiment, the ridges are located over the boundary of crystal grains that are included in the semiconductor layer.

Each of the ridges may include a peaked and raised portion, which is located at the boundary between three or more crystal grains in the semiconductor layer.

It is preferred that the semiconductor layer of the thin-film transistor have a uniform surface roughness over the entire surface thereof.

At least a portion of the respective semiconductor layers of the thin-film transistor and the thin-film diode may include a catalyst element that has the function of promoting the crystallization of the amorphous semiconductor film.

The thin-film diode may further have an intrinsic region, which is located between the n-type and p-type regions in the semiconductor layer of the thin-film diode. At least the intrinsic region of the semiconductor layer of the thin-film diode may have a greater surface roughness than the semiconductor layer of the thin-film transistor.

The thin-film transistor may include a number of thin-film transistors including an n-channel thin-film transistor and a p-channel thin-film transistor.

A method for fabricating a semiconductor device according to the present invention includes the steps of: (a1) providing a substrate, of which the surface is already covered with an amorphous semiconductor film; (b) forming an oxide layer on a portion of the amorphous semiconductor film; (c) irradiating and crystallizing the amorphous semiconductor film with a laser beam that has come from over the oxide layer, thereby obtaining a crystalline semiconductor film including a first crystallized region, in which the rest of the amorphous semiconductor film that is not covered with the oxide layer has been crystallized, and a second crystallized region, in which the portion of the amorphous semiconductor film that is covered with the oxide layer has been crystallized and which has a greater surface roughness than the first crystallized region; and (d) patterning the crystalline semiconductor film into a first semiconductor island to define the active region of a thin-film transistor and a second semiconductor island to define the active region of a thin-film diode. The first semiconductor island has the first crystallized region, and the second semiconductor island has the second crystallized region.

Another method for fabricating a semiconductor device according to the present invention includes the steps of: (a1) providing a substrate, of which the surface is already covered with an amorphous semiconductor film; (a2) irradiating the amorphous semiconductor film with a laser beam, thereby crystallizing and turning the amorphous semiconductor film into a crystalline semiconductor film; (b) forming an oxide layer locally on the crystalline semiconductor film; (c) irradiating the crystalline semiconductor film with a laser beam that has come from over the oxide layer and reducing the surface roughness of a part of the crystalline semiconductor film that is not covered with the oxide layer, thereby turning that part of the crystalline semiconductor film that is not covered with the oxide layer into a first crystallized region and the rest of the crystalline semiconductor film that is covered with the oxide layer into a second crystallized region with a greater surface roughness than the first crystallized region; and (d) patterning the crystalline semiconductor film into a first semiconductor island to define the active region of a thin-film transistor and a second semiconductor island to define the active region of a thin-film diode. The first semiconductor island has the first crystallized region, and the second semiconductor island has the second crystallized region.

Still another method for fabricating a semiconductor device according to the present invention includes the steps of: (a1) providing a substrate, of which the surface is already covered with an amorphous semiconductor film; (a2') adding a catalyst element that promotes crystallization to at least a part of the amorphous semiconductor film and then heating the amorphous semiconductor film, thereby crystallizing and turning the amorphous semiconductor film into a crystalline semiconductor film; (b) forming an oxide layer locally on the crystalline semiconductor film; (c) irradiating the crystalline semiconductor film with a laser beam that has come from over the oxide layer, thereby further crystallizing or re-crystallizing and turning a part of the crystalline semiconductor film that is not covered with the oxide layer into a first crystallized region and the rest of the crystalline semiconductor film that is covered with the oxide layer into a second crystallized region with a greater surface roughness than the first crystallized region; and (d) patterning the crystalline semiconductor film into a first semiconductor island to define the active region of a thin-film transistor and a second semiconductor island to define the active region of a thin-film diode. The first semiconductor island has the first crystallized region, and the second semiconductor island has the second crystallized region.

Yet another method for fabricating a semiconductor device according to the present invention includes the steps of: (a1) providing a substrate, of which the surface is already covered with an amorphous semiconductor film; (a2') adding a catalyst element that promotes crystallization to at least a part of the amorphous semiconductor film and then heating the amorphous semiconductor film, thereby crystallizing and turning the amorphous semiconductor film into a crystalline semiconductor film; (a3') irradiating and further crystallizing or re-crystallizing the crystalline semiconductor film with a laser beam; (b) forming an oxide layer locally on the crystalline semiconductor film; (c) irradiating the crystalline semiconductor film with a laser beam that has come from over the oxide layer and reducing the surface roughness of a part of the crystalline semiconductor film that is not covered with the oxide layer, thereby turning that part of the crystalline semiconductor film that is not covered with the oxide layer into a first crystallized region and the rest of the crystalline semiconductor film that is covered with the oxide layer into a second crystallized region with a greater surface roughness than the first crystallized region; and (d) patterning the crystalline semiconductor film into a first semiconductor island to define the active region of a thin-film transistor and a second semiconductor island to define the active region of a thin-film diode. The first semiconductor island has the first crystallized region, and the second semiconductor island has the second crystallized region.

In one preferred embodiment, the method further includes the step of removing a natural oxide film from that part of the amorphous semiconductor film that is not covered with the oxide layer before the step (c).

In another preferred embodiment, the step (c) is performed within an inert gas atmosphere such as a nitrogen gas ambient.

In still another preferred embodiment, the substrate is light transmissive. The step (a) includes the steps of: forming an opaque layer for cutting light that has come from under the opposite surface of the substrate on a region of the substrate, which will be located under the second semiconductor island to be the active region of a thin-film diode; and depositing the amorphous semiconductor film over the substrate on which the opaque layer has been formed. The step (b) includes the steps of: (b1) depositing an oxide film on either the amorphous semiconductor film or the crystalline semiconductor film; (b2) depositing a photoresist film on the oxide film and subjecting the photoresist film to exposure and development processes, thereby forming a photoresist pattern; and (b3) etching the oxide film using the photoresist pattern as a mask, thereby forming the oxide layer. The step (b2) includes exposing the photoresist film to the light that has come from under the opposite surface of the substrate using the opaque layer as a mask.

The step (b) preferably includes setting the thickness D (nm) of the oxide layer so that the thickness D and the refractive index n of the oxide layer and the wavelength λ (nm) of the laser beam in the step (c) satisfy the inequality: $D \leq \lambda/(4 \times n) \times 0.5$.

In yet another preferred embodiment, the method further includes the step of thinly oxidizing the surface of the amorphous semiconductor film before the step (a2).

In yet another preferred embodiment, the step (a2) is performed within an atmosphere including oxygen.

In yet another preferred embodiment, the step (c) includes radiating the laser beam with such a radiation energy density that is not too high to avoid resetting completely the crystal state of the crystalline semiconductor film that has been obtained in the step (a2).

In yet another preferred embodiment, the step (c) includes radiating the laser beam with such a radiation energy density that is not too high to avoid resetting completely the crystal state of the crystalline semiconductor film that has been obtained in the step (a2').

In yet another preferred embodiment, the method further includes the step of thinly oxidizing the surface of the amorphous semiconductor film before the step (a3').

In yet another preferred embodiment, the step (a3') is performed within an atmosphere including oxygen.

In yet another preferred embodiment, the step (c) includes radiating the laser beam with such a radiation energy density that is not too high to avoid resetting completely the crystal state of the crystalline semiconductor film that has been obtained in the step (a3').

In yet another preferred embodiment, the step (a3') includes radiating the laser beam with such a radiation energy density that is not too high to avoid resetting completely the crystal state of the crystalline semiconductor film that has been obtained in the step (a2').

Nickel may be used as the catalyst element in the step (a2').

In yet another preferred embodiment, the step (d) may include turning the second crystallized region into a portion of the second semiconductor island to be the intrinsic region of a thin-film diode. Alternatively, the step (d) may include turning the second crystallized region into the entire second semiconductor island.

In yet another preferred embodiment, the step (d) may include turning the first crystallized region into the entire first semiconductor island. Or the step (d) may include turning the first crystallized region into a semiconductor layer to be one of the two electrodes of a capacitor.

The method may further include the steps of: (h) forming a gate insulating film on the first semiconductor island; (i) forming a gate electrode on the gate insulating film so that the gate electrode overlaps a portion of the first semiconductor island to be a channel region; (j) doping portions of the first semiconductor island to be source/drain regions with a dopant element; (k) doping a portion of the second semiconductor island to be an n-type region with an re-type dopant element; and (l) doping another portion of the second semiconductor island to be a p-type region with a p-type dopant element.

A display device according to the present invention includes: a display area including a plurality of display units; and a frame area, which surrounds the display area. The device further includes a photosensor unit with a thin-film diode. Each display unit includes an electrode and a thin-film transistor that is connected to the electrode. The thin-film transistor and the thin-film diode have been formed on the same substrate. The thin-film transistor includes a crystalline semiconductor layer with a channel region and source and drain regions, a gate insulating film that is arranged to cover the crystalline semiconductor layer, and a gate electrode that is arranged on the gate insulating film to control the conductivity of the channel region. The thin-film diode includes a crystalline semiconductor layer that has at least an n-type region and a p-type region. The respective semiconductor layers of the thin-film transistor and the thin-film diode are crystalline semiconductor layers that have been formed by crystallizing the same amorphous semiconductor film. Ridges have been formed on the surface of the semiconductor layer of the thin-film diode. And the semiconductor layer of the thin-film diode has a greater surface roughness than that of the thin-film transistor.

In one preferred embodiment, the display unit further includes a backlight and a backlight controller for controlling the luminance of the light emitted from the backlight. The photosensor unit generates an illuminance signal representing the illuminance of external light and outputs the illuminance signal to the backlight controller.

In another preferred embodiment, the display device further includes multiple optical touchscreen sensors, each of which includes the photosensor unit and is arranged in the display area for associated one, two or more of the display units.

Advantageous Effects of Invention

According to the present invention, in a semiconductor device including a TFT and a TFD on the same substrate, the semiconductor layers of the TFT and the TFD can be optimized according to the device performances required. Consequently, the respective device performances that the TFT and the TFD should have can be achieved at the same time.

Particularly if the TFD is used as a photosensor, it is preferred that the semiconductor layer of the TFD have greater surface roughness than that of the TFT because the reliability of the TFT (as represented by the gate breakdown voltage) can be increased with the optical efficiency of the photosensor increased.

Also according to the manufacturing method of the present invention, such a semiconductor device can be fabricated easily without increasing the number of manufacturing process steps or the manufacturing cost. As a result, products of a smaller size and with enhanced performance can be obtained at a reduced cost.

DESCRIPTION OF EMBODIMENTS

Figure 1:
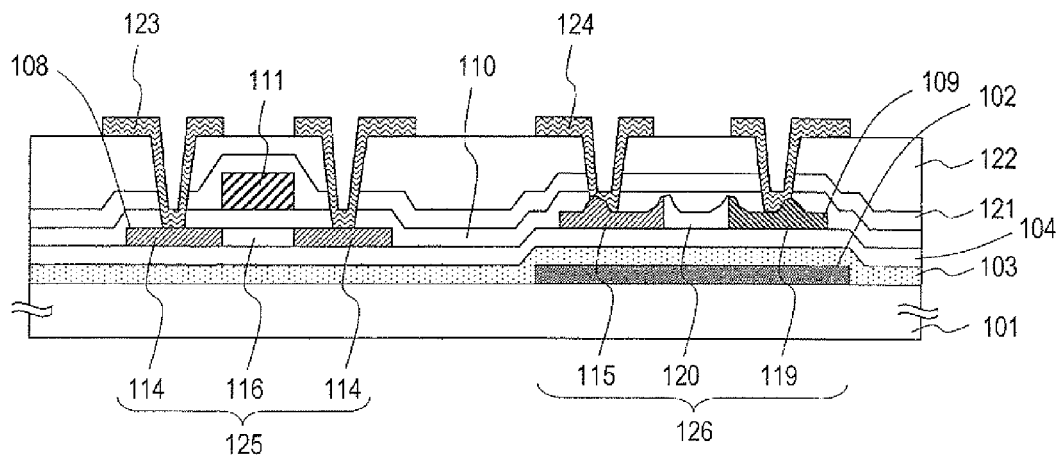
FIG. 1 is a schematic cross-sectional view illustrating a semiconductor device as a first preferred embodiment of the present invention.

To optimize the device performances of a TFT and a TFD on the same substrate, the present inventors carried out researches from different angles to find how the device performances were affected by the structures of the TFT's and TFD's semiconductor layers. As a result, the present inventors discovered that by controlling the surface roughness values of the TFT's and TFD's semiconductor layers, the respective device performances required could be achieved at the same time irrespective of the crystal states of those semiconductor layers.

Specifically, as for a TFD (e.g., a photosensor TFD to be used as a photosensor), by increasing the surface unevenness of its semiconductor layer, reflection of incoming light that has been incident on the semiconductor layer can be minimized and the amount of bright current to flow can be increased instead. As a result, sensitivity to external light (i.e., an SNR with respect to the incoming light, which is represented by the ratio of the amount of current to flow in a bright state to that of the current to flow in a dark state) can be increased. As for a TFT, on the other hand, if its semiconductor layer had great surface unevenness, then its reliability (in terms of a gate breakdown voltage, in particular) would decrease. For that reason, it is preferred that the surface unevenness of its semiconductor layer be reduced.

This is the basic idea of the present invention and one of its prime features is to make the TFD's semiconductor layer have a greater surface roughness than the TFT's. Then the TFD can have an increased amount of bright current flowing and can achieve higher optical efficiency, while the TFT ensures increased reliability. In the semiconductor device of the present invention, the respective semiconductor layers do not need to have different crystal states unlike its counterparts disclosed in Patent Documents Nos. 2 and 3. Thus, the semiconductor device of the present invention can be fabricated by performing a simpler process than theirs. It is particularly preferred that the surface roughness of the TFD's semiconductor layer be increased by taking advantage of the surface unevenness (i.e., ridges on the crystal grain boundary) to be produced while an amorphous semiconductor film is being crystallized.

Such surface unevenness is produced in the following manner. Specifically, after a semiconductor film has been once melted by being irradiated with a laser beam, crystal nuclei are created and the film is sequentially solidified from those nuclei. In the meantime, as those molten portions and solidified portions have mutually different volumes, crystal grain boundary portions to get solidified last tend to be raised in the shape of a range of mountains. Or at a triplet point or a multi-crystal intersection where three or more crystals intersect with each other, a peaked protrusion is formed. Such a portion that is raised like a range of mountains or like a mountain on the surface of a semiconductor film will be referred to herein as a "ridge". In the prior art, it has been widely believed that if there were such ridges on the surface of a semiconductor layer (i.e., at a channel interface), a TFT should have deteriorated interface property or decreased field effect mobility and that as the electric field would have an excessively high intensity around the crest of such a ridge, the gate insulating film should have a decreased breakdown voltage and would lose reliability. That is why it has been considered an important task to minimize such ridges and various attempts have been made in order to eliminate those ridges. To the contrary, the present invention provides a means for improving the performance of a TFD by using those ridges intentionally.

Specifically, according to the present invention, the TFT's and TFD's semiconductor layers may be made to have mutually different surface roughnesses in the following manner (which will be referred to herein as a "first method").

First of all, an amorphous semiconductor film is deposited on a substrate. Next, an oxide film (or oxide layer) is selectively formed on only a portion of the amorphous semiconductor film to define a TFD's active region. And then the amorphous semiconductor film is irradiated and crystallized with a laser beam that has been radiated from over the substrate. As a result, a portion covered with the oxide layer will have a greater surface roughness than the other portion that is not covered with the oxide layer.

Such an increase in surface roughness to be caused in a portion masked with an oxide layer by crystallizing an amorphous semiconductor film with a laser beam was actually observed by the present inventors while testing various process parameters in order to improve the crystallinity of a crystalline semiconductor film by irradiating it with a laser beam. It is not quite clear exactly how and why the surface unevenness would increase in such a situation. However, the present inventors believe that absorption of oxygen into a semiconductor film being melted and solidified by being irradiated with a laser beam during the crystal growing process should have something to do with that increase in surface roughness. This is because if oxygen entered the atmosphere in which a laser crystallization process is being carried out on a substrate covered with no oxide layer at all, then the surface unevenness would also tend to increase. And the higher the partial pressure of oxygen, the greater the surface unevenness produced will be.

Optionally, this first method may be replaced with the following second method. First of all, an amorphous semiconductor film is deposited on a substrate. And the entire amorphous semiconductor film is irradiated and crystallized with a laser beam. After that, an oxide film is selectively deposited on only a portion of the crystalline semiconductor film to define a TFD's active region and a natural oxide film is removed from the other regions. Subsequently, the crystalline semiconductor film is irradiated with a laser beam again in an inert gas atmosphere, thereby planarizing only those portions that are not covered with the oxide film. Meanwhile, that portion covered with the oxide film will either maintain the as-crystallized surface state or come to have an increased surface roughness.

As used herein, the "surface roughness" refers to either the arithmetic average roughness Ra or maximum height Rz as defined by JIS B 0601-2001. Thus, the TFD's semiconductor layer should have either the greater arithmetic average roughness Ra or the greater maximum height Rz than the TFT's semiconductor layer. Then, the surface of the TFD's semiconductor layer will reflect less light than that of the TFT's semiconductor layer.

More specifically, according to this preferred embodiment, the maximum height Rz is determined by the height of the tallest ridge, irrespective of the number (or density) of ridges on the surface. On the other hand, even if the ridges are low but if the ridges have a high density, the arithmetic average roughness Ra will be large. Considering exactly how those ridges grow, generally speaking, the lower the density of the ridges (i.e., the greater the crystal grain size), the taller the ridges tend to be.

And the taller those ridges on the surface of the semiconductor layer, the more effectively those ridges will reduce reflection of the incoming light and the higher the performance of the photosensor TFD can be. For that reason, if the maximum height Rz is greater on the surface of the TFD's semiconductor layer than on the surface of the TFT's semiconductor layer, the effects described above can be achieved irrespective of the magnitude of the arithmetic average roughness Ra.

Also, the higher the density of ridges on the surface of the semiconductor layer (i.e., the greater the arithmetic average roughness Ra), the more effectively those ridges can reduce reflection of the incoming light. That is why if the arithmetic average roughness Ra is greater on the surface of the TFD's semiconductor layer than on the surface of the TFT's semiconductor layer, the effects described above can be achieved irrespective of the magnitude of the maximum height Rz.

Nevertheless, it is more preferred that the surface of the TFD's semiconductor layer have the greater arithmetic average roughness Ra and the greater maximum height Rz than the surface of the TFT's semiconductor layer. This is because in that case, it is even easier to minimize reflection of the incoming light and keep the TFT's reliability sufficiently high with the TFD's SNR increased.

The oxide layer for use in the first and second methods preferably has its thickness defined so as not to produce any antireflection effect against the laser beam. The reason is that if the oxide layer had its thickness defined so as to produce antireflection effect, a portion of the semiconductor film that is located under that oxide layer would have its surface irradiated with greater substantial energy. In that case, that portion of the semiconductor film covered with the oxide layer and the rest of the semiconductor film not covered with the oxide layer would have mutually different crystal states. In such a situation, if that portion covered with the oxide layer were irradiated with a laser beam with appropriate radiation energy, then the other portion not covered with the oxide layer would be irradiated with insufficient energy and would not have a good crystal state. As a result, the degree of crystallinity of the semiconductor layer to define a TFT's active region would be much inferior to that of the semiconductor layer to define a TFD's active region and the expected TFT performance would not be achieved. Conversely, if the portion not covered with the oxide layer were irradiated with a laser beam with appropriate radiation energy, then the other portion covered with the oxide layer would be irradiated with excessive energy that surpasses the energy range to achieve a good crystal state and would have an extremely poor crystal state with some microcrystalline components. As a result, the degree of crystallinity of the semiconductor layer to define a TFD's active region would be much inferior to that of the semiconductor layer to define a TFT's active region and the expected TFD performance could not be achieved. For that reason, if the oxide layer functioned as an antireflection film, the semiconductor layers to define a TFT's active region and a TFD's active region could certainly have different surface roughnesses but would also have their degrees of crystallinity varied. Then, it should be difficult to control the degree of crystallinity and the surface roughness independently of each other. On the other hand, if an oxide layer with no antireflection effect is used, then only the surface roughness of that portion covered with the oxide layer can be greater than that of the other portion without increasing the substantial energy applied to that portion covered with the oxide layer. Consequently, only the surface roughnesses of the semiconductor layers to define the TFT's and TFD's active regions can be made different from each other with their degrees of crystallinity substantially equalized with each other.

Meanwhile, it was also proposed that the surface unevenness to be produced on an amorphous semiconductor film being irradiated with a laser beam during its crystallization be reduced by irradiating the semiconductor film with a laser beam through a cap layer (see Japanese Patent Application Laid-Open Publication No. 2005-347560, for example). Furthermore, a technique for planarizing a semiconductor film by irradiating the semiconductor film with a laser beam through a cap layer was also proposed (in Japanese Patent Application Laid-Open Publication No. 2007-288159, for example). According to these proposed techniques, by using the rigidity of the cap layer, those ridges to be formed due to the volume expansion of the semiconductor film being melted and solidified are intentionally flattened. Thus, the cap layer is provided for a totally different purpose from the oxide layer of the present invention that is used to grow those ridges. More particularly, as for those cap layers, their rigidity is a key to ironing out those ridges as intended. For that reason, the cap layers are preferably as rigid as possible and as thick as possible. For example, according to those proposed techniques, the cap layers used are as thick as 2 μm or 100-300 nm. To the contrary, the oxide layer of the present invention is provided in order to avoid producing such an effect of flattening the ridges. For that purpose, the oxide layer may have a thickness of 30 nm or less, for example. Also, the lower the rigidity of the oxide layer, the better. In other words, as long as the oxide layer can increase the surface roughness of the semiconductor film under itself, the oxide layer is preferably as thin as possible.

No matter whether the first method or second method is adopted, before the amorphous semiconductor film is deposited, an opaque layer may be formed on the TFD's semiconductor layer so as to cut off the light that has come from under the substrate. In that case, the oxide film may be patterned by performing a self-aligning process in which the oxide film is irradiated with the light that has come from under the back surface of the substrate using the opaque layer as a mask. Then, the number of photomasks to use can be reduced.

If the TFT's and TFD's semiconductor layers have been formed by the first method, the ridges are also formed on the surface of the TFT's semiconductor layer. However, the average height of those ridges on the TFT's semiconductor layer is smaller than that of the ridges on the TFD's semiconductor layer.

On the other hand, if the TFT's and TFD's semiconductor layers have been formed by the second method, the TFT's semiconductor layer has a substantially flat surface, which refers herein to a surface that has been subjected to a planarization process and which may have a surface roughness (i.e., an arithmetic average roughness) Ra of 3 nm or less.

According to this preferred embodiment, the TFT's semiconductor layer preferably has a substantially uniform surface roughness all over its surface. Then, the TFT can have increased reliability.

Optionally, at least part of the TFT's and TFD's semiconductor layers may include a catalyst element that promotes the crystallization of the amorphous semiconductor film.

The TFD may further have an intrinsic region between the n-type and p-type regions of the TFD's semiconductor layer. In that case, at least the intrinsic region of the TFD's semiconductor layer preferably has a greater surface roughness than the TFT's semiconductor layer (in its channel region, among other things).

Embodiment 1

Hereinafter, a first preferred embodiment of a semiconductor device according to the present invention will be described. The semiconductor device of this preferred embodiment includes an n-channel TFT and a TFD on the same substrate and may be used as an active-matrix-addressed display device with a sensor section, for example.

FIG. 1 is a schematic cross-sectional view illustrating an exemplary semiconductor device according to this preferred embodiment. The semiconductor device of this preferred embodiment typically includes a number of TFTs and a number of TFDs on the same substrate. In FIG. 1, however, the configurations of just one of those TFTs and only one of those TFDs are illustrated for the sake of simplicity. Also, in FIG. 1, illustrated as an exemplary TFT is an n-channel TFT with a single drain structure. However, the TFT does not always have such a structure. Alternatively, the semiconductor device may also include a TFT with an LDD or GOLD structure or may include a number of TFTs including an n-channel TFT and a p-channel TFT.

The semiconductor device of this preferred embodiment includes a thin-film transistor 125 and a thin-film diode 126, which are arranged on a substrate 101 with undercoat films 103 and 104 interposed between them. The thin-film transistor 125 includes a semiconductor layer 108 with a channel region 116 and source/drain regions 114, a gate insulating film 110 on the semiconductor layer 108, a gate electrode 111 that controls the conductivity of the channel region 116, and electrodes and interconnects 123 that are connected to the source/drain regions 114. On the other hand, the thin-film diode 126 includes a semiconductor layer 109 with at least an n-type region 115 and a p-type region 119 and electrodes and interconnects 124 that are connected to the n- and p-type regions 115 and 119. In the example illustrated in FIG. 1, an intrinsic region 120 is defined between the n- and p-type regions 115 and 119 of the semiconductor layer 109.

The thin-film transistor 125 and the thin-film diode 126 are coated with a silicon nitride film 121 and a silicon dioxide film 122 as interlevel dielectric films. Also, if the substrate 101 is a light-transmissive one, an opaque film 102 may be arranged between the semiconductor layer 109 of the thin-film diode 126 and the substrate 101 to prevent light that has come from under the back surface of the substrate 101 from entering the semiconductor layer 109.

The respective semiconductor layers 108 and 109 of the thin-film transistor 125 and thin-film diode 126 are crystalline semiconductor layers obtained by crystallizing the same amorphous semiconductor film. Also, ridges have been formed on the surface of the semiconductor layer 109 of the thin-film diode 126. These ridges are produced while the amorphous semiconductor film being irradiated and crystallized with a laser beam is melting and solidifying. Typically, those ridges are located on the boundary between crystal grains in the semiconductor layer 109.

The semiconductor layer 109 of the thin-film diode 126 has a greater surface roughness than the semiconductor layer 108 of the thin-film transistor 125. In that case, the following advantages are obtained.

Specifically, the surface of the semiconductor layer 109 of the thin-film diode 126 has a greater surface roughness, and therefore, reflects much less incoming light and comes to have increased sensitivity to the light. As a result, the bright current increases and the brightness to darkness ratio, which is represented by an SNR, can be increased. If the semiconductor layer 109 of the thin-film diode 126 has an arithmetic average roughness Ra of 6 nm or more and/or a maximum height Rz of 60 nm or more, for example, the SNR can be increased more effectively. In the thin-film transistor 125, on the other hand, the semiconductor layer 108 preferably has a relatively small surface roughness (e.g., an arithmetic average roughness Ra of 5 nm or less and/or a maximum height Rz of 50 nm or less). Then, the reliability can be increased in terms of the breakdown voltage of the gate insulating film and the gate bias stress, and the field effect mobility can be increased, too.

Thus, according to this preferred embodiment, the respective semiconductor layers 108 and 109 of the thin-film transistor 125 and the thin-film diode 126 (especially a photosensor TFD) can have quite different surface roughness values only with no significantly different degrees of crystallinity. As a result, the performances of these components can be optimized according to their requirements.

The surface roughness values of these semiconductor layers 108 and 109 are not particularly limited. For example, if the semiconductor layers 108 and 109 are formed out of an amorphous silicon semiconductor film with a thickness of 50 nm, the semiconductor layer 108 of the thin-film transistor 125 may have an arithmetic average roughness Ra of 3-5 nm and the semiconductor layer 109 of the thin-film diode 126 may have an arithmetic average roughness Ra of 6-10 nm. Also, in this preferred embodiment, the semiconductor layer 108 of the thin-film transistor 125 has a maximum height Rz (as defined by JIS B 0601-2001) of 30-50 nm, while the semiconductor layer 109 of the thin-film diode 126 has a maximum height Rz of 60-100 nm. If the semiconductor layers 108 and 109 have surface roughness values falling within these ranges, the photosensitivity (as represented by a bright current value) of the thin-film diode 126 will be approximately 1.3 times as high as that of a thin-film diode, of which the surface roughness layer is as high as that of the thin-film transistor 125.

According to this preferred embodiment, the degrees of crystallinity of the semiconductor layers 108 and 109 may be either different from each other or substantially equal to each other. If the respective semiconductor layers 108 and 109 of the thin-film transistor 125 and the thin-film diode 126 have substantially the same degree of crystallinity, there is no need to control the crystal states of the semiconductor layers 108 and 109 independently of each other. That is why a high-reliability, high-performance semiconductor device can be obtained without complicating its manufacturing process. Also, the average crystal grain sizes of these semiconductor layers 108 and 109 may be either different from each other or substantially equal to each other.

The semiconductor device of this preferred embodiment may be fabricated in the following manner, for example.

Figure 2:
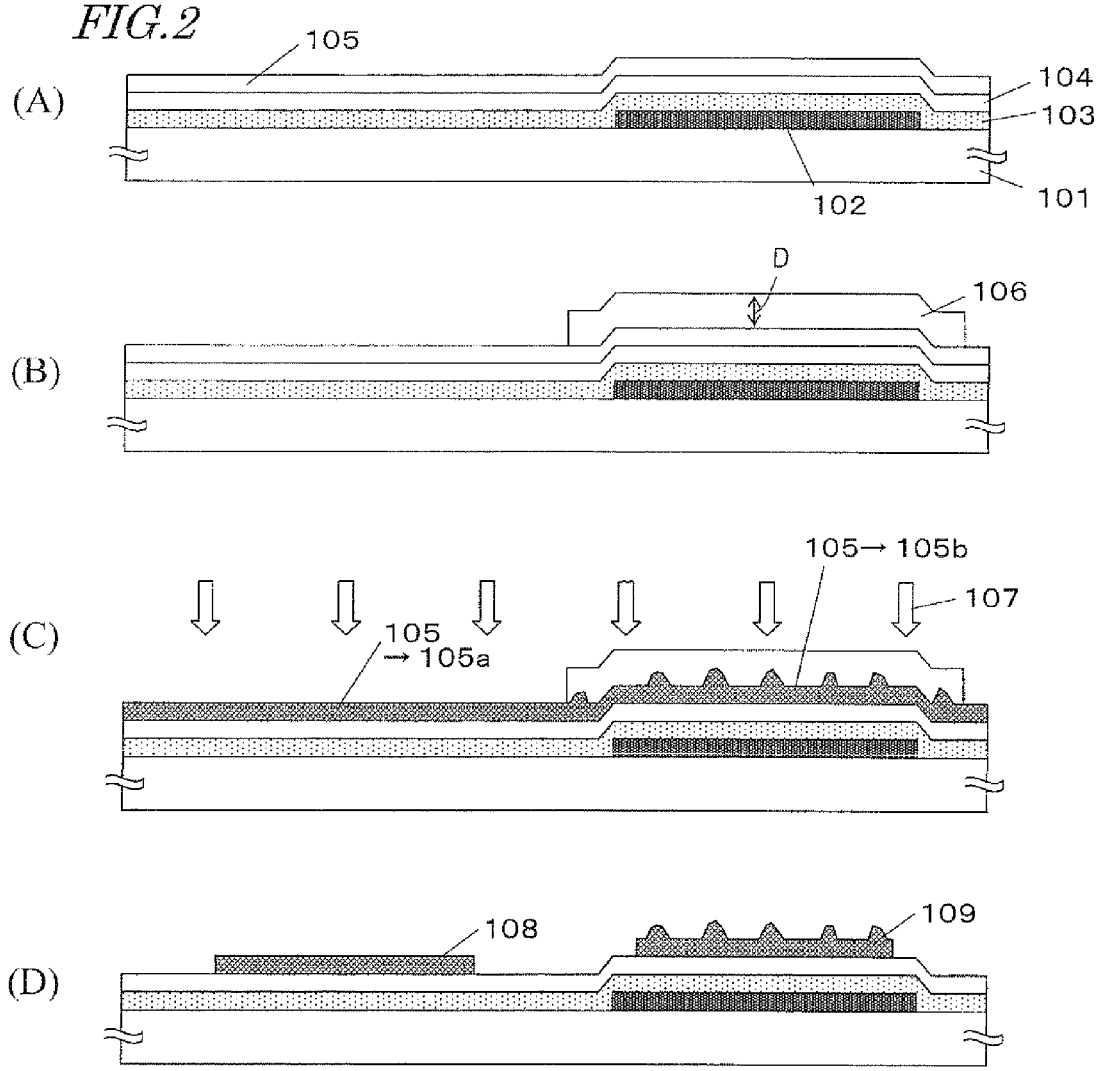
FIGS. 2(A) through 2(D) are schematic cross-sectional views illustrating respective manufacturing process steps to fabricate the semiconductor device of the first preferred embodiment of the present invention.

First of all, as shown in FIG. 2(A), an opaque layer 102 is formed on a substrate 101 and then a silicon nitride film 103 and a silicon dioxide film 104 are deposited thereon in this order as undercoat films. Thereafter, an amorphous semiconductor film (e.g., an amorphous silicon film in this example) 105 is deposited on these layers and films.

A low alkali glass substrate or a quartz substrate may be used as the substrate 101. In this preferred embodiment, a low alkali glass substrate is used. In that case, the glass substrate may be heat-treated in advance to a temperature that is lower than the glass stain point by about 10-20° C.

The opaque layer 102 is arranged so as to prevent the light that has come from under the back surface of the substrate from entering the TFD. The opaque layer 102 may be made of a metal film or a silicon film, for example. If a metal film is used, a refractory metal such as tantalum (Ta), tungsten (W) or molybdenum (Mo) is preferred considering the heat treatment to be carried out at a later stage of the manufacturing process. In this preferred embodiment, a Mo film is deposited by sputtering process and then patterned, thereby forming the opaque layer 102. In this case, the opaque layer 102 may have a thickness of 20 nm to 200 nm and preferably has a thickness of 30 nm to 150 nm (e.g., 100 nm in this preferred embodiment).

The silicon nitride film 103 and silicon dioxide film 104 are provided to prevent impurities from diffusing from the substrate 101. In this preferred embodiment, these undercoat films 103 and 104 are formed by plasma CVD process. The combined thickness of these undercoat films 103 and 104 may be 100 to 600 nm and is preferably in the range of 150 to 450 nm. Although a two-layered undercoat film is used in this preferred embodiment, a single layer of silicon dioxide may also be used, for example.

The amorphous silicon film 105 may be formed by a known process such as a plasma CVD process or a sputtering process. In this preferred embodiment, an amorphous silicon film is deposited to a thickness of 50 nm by plasma CVD process. Optionally, if the undercoat films 103 and 104 and the amorphous silicon film 105 are formed by the same deposition process, these films may be deposited continuously. If the substrate on which the undercoat films have been deposited is not exposed to the air, contamination on its surface can be avoided and variations in characteristic or the threshold voltage between the TFTs to fabricate can be reduced.

Next, as shown in FIG. 2(B), an oxide layer (of silicon dioxide in this example) 106 is selectively formed on only a portion of the amorphous silicon film 105 that will define the active region of a TFD. The oxide layer 106 is formed by depositing a silicon dioxide film over the entire surface of the substrate 101 by plasma CVD process, for example, and then patterned. In this preferred embodiment, the silicon dioxide layer 106 is formed to have a thickness D of 20 nm.

Thereafter, as shown in FIG. 2(C), the amorphous silicon film 105 is irradiated and crystallized with a laser beam 107 that has been radiated from over the substrate 101. In this process step, an XeCl excimer laser beam (with a wavelength of 308 nm and a pulse width of 40 nsec) or a KrF excimer laser beam (with a wavelength of 248 nm) may be used as the laser beam. In this preferred embodiment, an XeCl excimer laser beam with a wavelength of 308 nm is used. The sizes of the laser beam spot are determined so that an elongated beam spot is formed on the surface of the substrate 101. And by sequentially scanning the surface of the substrate 101 perpendicularly to the direction in which the beam spot is elongated, the amorphous silicon film gets crystallized over the entire surface of the substrate. In this case, it is preferred that the surface is scanned so that the beam spots partially overlap with each other. In that case, an arbitrary point on the amorphous silicon film 105 will be irradiated with the laser beam a number of times, thus contributing to increasing the uniformity.

As a result, the amorphous silicon film 105 is melted instantaneously and crystallized while being solidified and eventually turns into a crystalline silicon film. A portion 105b of the crystalline silicon film that is covered with the silicon dioxide layer 106 comes to have a greater surface roughness than the other portion 105a that is not covered with the silicon dioxide layer 106. This is because ridges have been formed on the surface of the crystalline silicon film during the melting and solidifying process but because the ridges are higher in that portion 105b covered with the silicon dioxide layer 106 than in the other portion 105a. It should be noted that these portions 105b and 105a have substantially the same degree of crystallinity and crystal grain size.

Before the amorphous silicon film is irradiated with the laser beam 107, a natural oxide film is preferably removed from its portion that is not covered with the silicon dioxide layer 106. Then, it is possible to prevent the ridges from becoming too high in the portion 105a and further reduce the surface roughness there. It is even more preferred that the laser beam 107 be radiated within an inert gas atmosphere such as nitrogen gas ambient because the surface roughness of the region 105a can be further reduced in that case.

Thereafter, as shown in FIG. 2(D), the silicon dioxide layer 106 is removed and then excessive portions of the crystalline silicon film are removed, thereby electrically isolating these two element regions from each other. As a result, a semiconductor layer 108 to be the active region (including source/drain regions and a channel region) of a TFT is formed out of the portion 105a and a semiconductor layer 109 to be the active region (including $n^+$ or $p^+$ region and an intrinsic region) of a TFD is formed out of the portion 105b.

Figure 3:
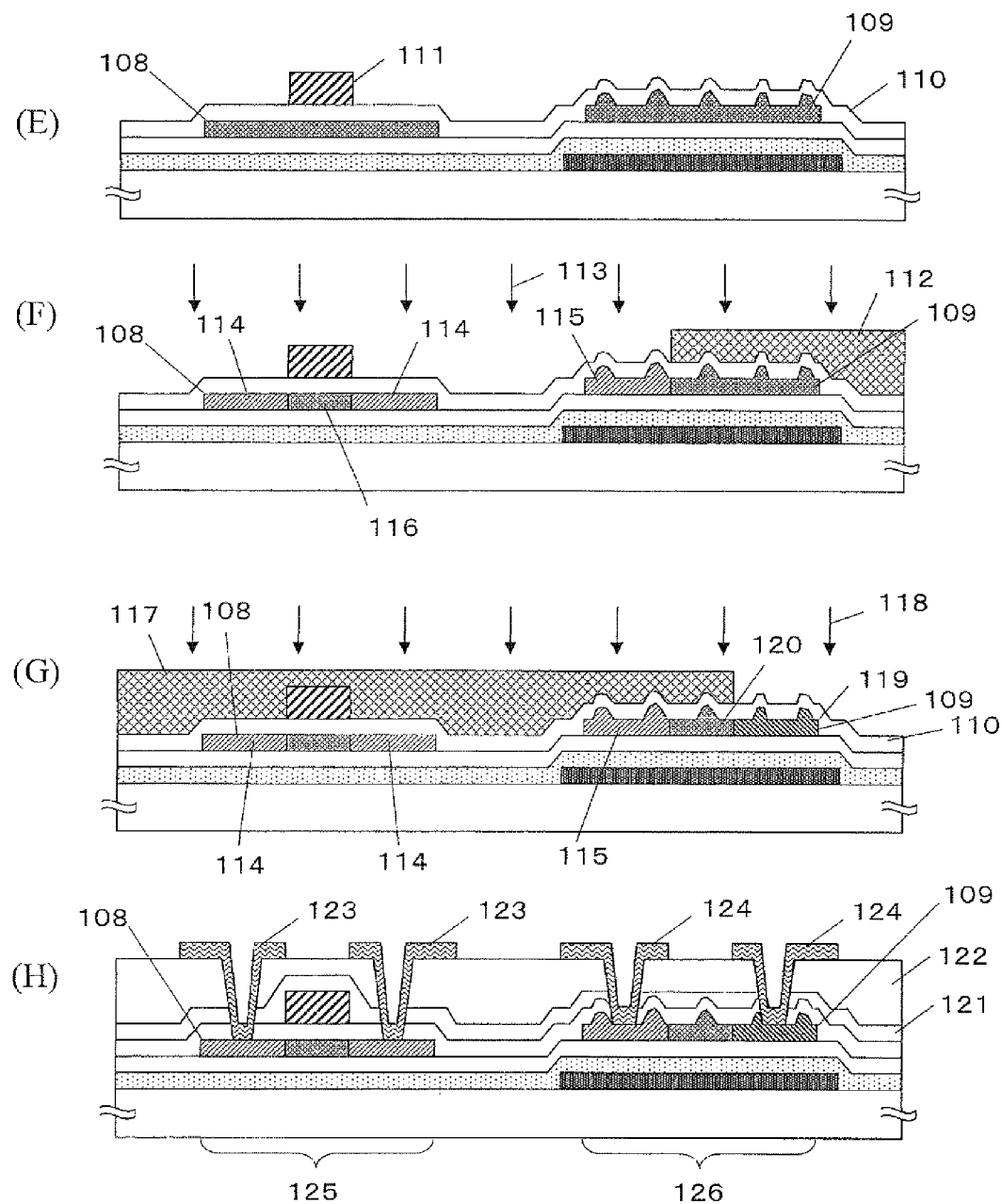
FIGS. 3(E) through 3(H) are schematic cross-sectional views illustrating respective manufacturing process steps to fabricate the semiconductor device of the first preferred embodiment of the present invention.

Subsequently, as shown in FIG. 3(E), a gate insulating film 110 is deposited over these semiconductor islands 108 and 109 and then a metallic material to be a TFT's gate electrode 111 (which will be referred to herein as the "gate electrode 111" for convenience sake) is deposited on the gate insulating film 110.

The gate insulating film 110 is preferably a silicon dioxide film with a thickness of 20 nm to 150 nm. In this preferred embodiment, a silicon dioxide film with a thickness of 100 nm is used.

The gate electrode 111 may be formed by depositing a conductive film on the gate insulating film 110 by sputtering or CVD process, for example, and then patterning it. The conductive film to deposit in this process step is preferably a refractory metal such as W, Ta, Ti or Mo or an alloy thereof, and preferably has a thickness of 300 nm to 600 nm. In this preferred embodiment, a tantalum (Ta) film including a very small amount of nitrogen as additive was deposited to a thickness of 450 nm.

Thereafter, as shown in FIG. 3(F), a photoresist mask 112 is formed on the gate insulating film 110 so as to partially cover the semiconductor layer 109 to be the active region of a TFD, and ions 113 of an n-type dopant (such as phosphorus) are implanted into the entire surface of the substrate 101 from over it. The phosphorus ions 113 pass through the gate insulating film 110 to get implanted into the semiconductor layers 108 and 109. As a result of this process step, the phosphorus ions 113 are implanted into the exposed portion of the TFD's semiconductor layer 109, which is not covered with the photoresist mask 112, and into that of the TFT's semiconductor layer 108, which is not masked with the gate electrode 111. However, the phosphorus ions 113 are implanted into neither the portion that is covered with the photoresist mask 112 nor the portion that is masked with the gate electrode 111. Consequently, those portions of the TFT's semiconductor island 108, which have been implanted with the phosphorus ions 113, will be the source/drain regions 114 of the TFT, while the portion masked with the gate electrode 111 and implanted with no phosphorus ions 113 will be the channel region 116 of the TFT. On the other hand, the portion of the TFD's semiconductor layer 109, which has been implanted with the phosphorus ions 113, will be the $n^+$ region 115 of the TFD.

Next, the photoresist mask 112 is stripped and then another photoresist mask 117 is formed on the gate insulating film 110 so as to cover a part of the semiconductor layer 109 to be the active region of a TFD and the entire semiconductor layer 108 to be the active region of a TFT, and ions 118 of a p-type dopant (such as boron) are implanted into the entire surface of the substrate 101 from over it as shown in FIG. 3(G). In this process step, the ions of boron 118 pass through the gate insulating film 110 and get implanted into the semiconductor layer 109. As a result of this process step, the boron ions 118 are implanted into the exposed portion of the TFD's semiconductor layer 109, which is not covered with the photoresist mask 117. That is to say, no boron ions 118 are introduced into the regions covered with the photoresist mask 117. Consequently, that portion of the TFD's semiconductor layer 109, which has been implanted with the boron ions 118, will be the $p^+$ region 119 of the TFD, while the portion that has been implanted with no boron or phosphorus ions will be the intrinsic region 120 thereof.

Subsequently, the photoresist mask 117 is stripped and then the substrate is thermally treated within an inert atmosphere (e.g., a nitrogen gas ambient). As a result of this heat treatment process, various doping damages such as crystal imperfections that have been caused during the ion implantation process steps in the portions to be the source/drain regions 114 of a TFT and in the portions to be the $n^+$ and $p^+$ regions 115 and 119 of a TFD are repaired and the phosphorus and boron dopant atoms introduced there are activated. The heat treatment process of this process step may be carried out with a normal heating furnace but is preferably performed as a rapid thermal annealing (RTA). Among other things, it is particularly preferred that the temperature of the substrate be raised or lowered instantaneously by spraying a high-temperature inert gas against the surface of the substrate.

Thereafter, as shown in FIG. 3(H), a silicon nitride film 121 and a silicon dioxide film 122 are deposited in this order as interlevel dielectric films. If necessary, a heat treatment process may be carried out to hydrogenate the semiconductor layers 108 and 109. For example, these layers 108 and 109 may be annealed at a temperature of 350° C. to 450° C. within either a nitrogen gas ambient or a hydrogen gas mixed ambient at the atmospheric pressure. After that, contact holes are cut through the interlevel dielectric films 121 and 122 and a metallic material film (e.g., a stack of titanium nitride and aluminum) is deposited on the interlevel dielectric film 122 and in the contact holes and patterned into electrodes and interconnects 123 and 124 to form parts of a TFT and a TFD. In this manner, a thin-film transistor 125 and a thin-film diode 126 are completed. Optionally, to protect these devices, a passivation film of silicon nitride, for example, may be deposited over the thin-film transistor 125 and the thin-film diode 126.

According to this method, semiconductor layers 108 and 109 with mutually different degrees of surface roughness can be formed without complicating the manufacturing process.

According to the method described above, the thickness D (nm) of the oxide layer (i.e., the silicon dioxide layer 106 in this example) formed in the process step shown in FIG. 2(B) is preferably set so that the thickness D and the refractive index n of the oxide layer and the wavelength λ (nm) of the laser beam satisfy the inequality: D≤λ/(4×n)×0.5. Then, the antireflection effect of the oxide layer can be reduced so much that the difference in the degree of crystallinity between the portion 105b covered with the oxide layer and the portion 105a not covered with the oxide layer can be minimized. That is to say, in that case, these portions 105a and 105b can have substantially the same crystal state and their only major difference should be their surface roughness. In this preferred embodiment, the silicon dioxide film has a refractive index n of 1.46 and the laser beam has a wavelength λ of 308 nm. That is why the silicon dioxide layer 106 preferably has a thickness D of 26 nm or less. Nevertheless, if the oxide layer were too thin, the surface roughness of that portion 105b covered with the oxide layer could not be increased sufficiently. For that reason, it is preferred that the oxide layer have a thickness D of at least 3 nm.

In the example described above, a silicon dioxide layer 106 is formed as the oxide layer. However, the same effect would also be achieved even if the silicon dioxide layer 106 were replaced with any other oxide layer such as a silicon oxynitride layer.

Embodiment 2

Hereinafter, a second preferred embodiment of the present invention will be described with reference to the accompanying drawings. In a method for fabricating a semiconductor device according to this second preferred embodiment, a catalyst element is used to crystallize an amorphous semiconductor film and the process step of removing the catalyst element by gettering is performed after the step of crystallizing, which are two major differences from the manufacturing process of the first preferred embodiment described above.

Figure 4:
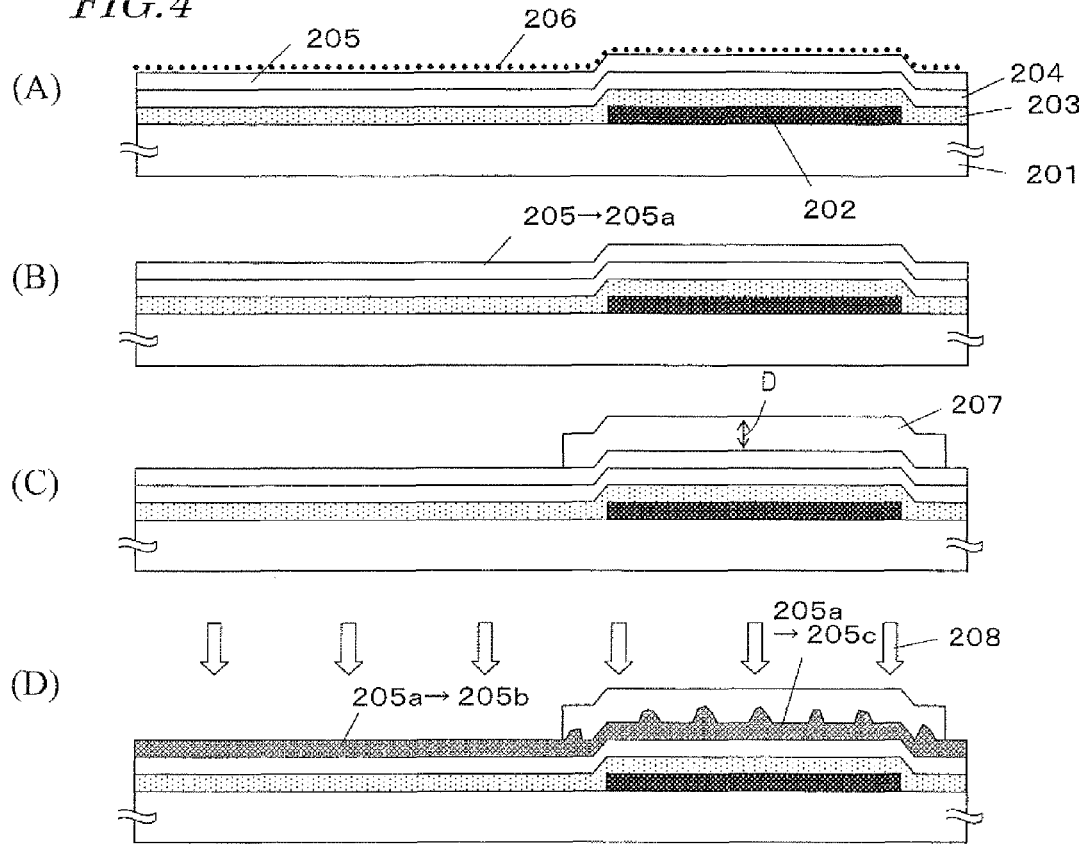
FIGS. 4(A) through 4(D) are schematic cross-sectional views illustrating respective manufacturing process steps to fabricate a semiconductor device according to a second preferred embodiment of the present invention.

First of all, as shown in FIG. 4(A), an opaque layer 202, a silicon nitride film 203, a silicon dioxide film 204 and an amorphous semiconductor film (amorphous silicon film) 205 are stacked in this order on a substrate 201. These layers and films are formed just as already described with reference to FIG. 2(A). Next, a catalyst element 206 is added to the surface of an amorphous silicon film 205.

Specifically, the surface of the amorphous silicon film 205 is coated with an aqueous solution including approximately 5 ppm by weight of catalyst element 206 (e.g., nickel in this preferred embodiment) such as an aqueous solution of nickel acetate by spin coating process. The catalyst element(s) 206 is/are preferably one or multiple elements selected from the group consisting of iron (Fe), cobalt (Co), tin (Sn), lead (Pb), palladium (Pd) and copper (Cu) as well as nickel (Ni). Although their catalyst effects are lower than those of the former group of elements, ruthenium (Ru), rhodium (Rh), osmium (Os), iridium (Ir), platinum (Pt) or gold (Au) may also serve as a catalyst element. The dose of the catalyst element to be added in this process step is very small. And the concentration of the catalyst element at the surface of the amorphous silicon film 205 is controlled by total reflection X-ray fluorescence (TRXRF) analysis. In this preferred embodiment, the catalyst element has a concentration of approximately $5 \times 10^{12}$ atoms/cm$^2$. Optionally, before this process step is performed, the surface of the amorphous silicon film 205 may be slightly oxidized with ozone water, for example, to increase the wettability at the surface of the amorphous silicon film 205 during the spin-coating process.

In this preferred embodiment, nickel is supposed to be introduced by spin coating process. However, a thin film of a catalyst element 206 (e.g., a nickel film in this preferred embodiment) may be formed on the amorphous silicon film 205 by evaporation process or sputtering process, for example.

Next, as shown in FIG. 4(B), the amorphous silicon film 205 is heated, thereby producing a solid-phase crystallization in the amorphous silicon film 205 using the catalyst element 206 as a nucleus. In this manner, a first crystalline silicon film 205a can be obtained.

The heat treatment is preferably carried out within an inert atmosphere (e.g., a nitrogen gas ambient) at a temperature of 550° C. to 620° C. for any required length of time between 30 minutes and 4 hours. In this preferred embodiment, the heat treatment is conducted at 590° C. for an hour. As a result of this heat treatment, the nickel atoms 206 that have been added to the surface of the amorphous silicon film 205 diffuse through the amorphous silicon film 205 and also produce silicides, thereby crystallizing the amorphous silicon film 205 using those silicides as nuclei of crystal growth. Although the crystallization process is produced in this preferred embodiment by heat treatment process using a furnace, the crystallization may also be produced with a rapid thermal annealing (RTA) system that uses a lamp as a heat source.

Subsequently, as shown in FIG. 4(C), a silicon dioxide layer 207 is formed on only a portion of the first crystalline silicon film 205a that will define the active region of a TFT. The silicon dioxide layer 207 may be formed just as already described with reference to FIG. 2(B). In this preferred embodiment, the silicon dioxide layer 207 is formed to have a thickness D of 15 nm.

Next, as shown in FIG. 4(D), the first crystalline silicon film 205a is irradiated with a laser beam 208. In this preferred embodiment, an XeCl excimer laser beam with a wavelength of 308 nm is radiated as in the laser radiation process step of the first preferred embodiment shown in FIG. 2(C). As a result of this process step, the first crystalline silicon film 205a is re-crystallized to be a second crystalline silicon film of even higher quality. In this case, a portion 205c of the second crystalline silicon film that is covered with the silicon dioxide layer 207 comes to have a greater surface roughness than the other portion 205b that is not covered with the silicon dioxide layer 207.

It should be noted that if there were any oxide film left on that exposed portion of the first crystalline silicon film 205a that is not covered with the silicon dioxide layer 207, then the surface roughness of that portion 205b would increase when irradiated with the laser beam 208. For that reason, it is preferred that before the first crystalline silicon film 205a is irradiated with the laser beam 208, a natural oxide film be removed from that exposed portion that is not covered with the silicon dioxide layer 207. Then, it is possible to prevent the surface roughness of that portion 205b from being increased by the laser radiation. It is even more preferred that the laser beam 208 be radiated in an inert atmosphere such as nitrogen gas ambient because the surface roughness of the portion 205b can be further reduced in that case. Also, in this process step, the radiation energy density of the laser beam 208 is preferably defined to be not too high to avoid resetting the crystal state of the first crystalline silicon film 205a (shown FIG. 4(B)). Then, the laser beam 208 will work fine only on the amorphous parts or crystal imperfections remaining in the first crystalline silicon film 205a so as to increase its degree of crystallinity. Consequently, a second crystalline silicon film with good homogeneity and excellent crystallinity can be obtained.

Figure 5:
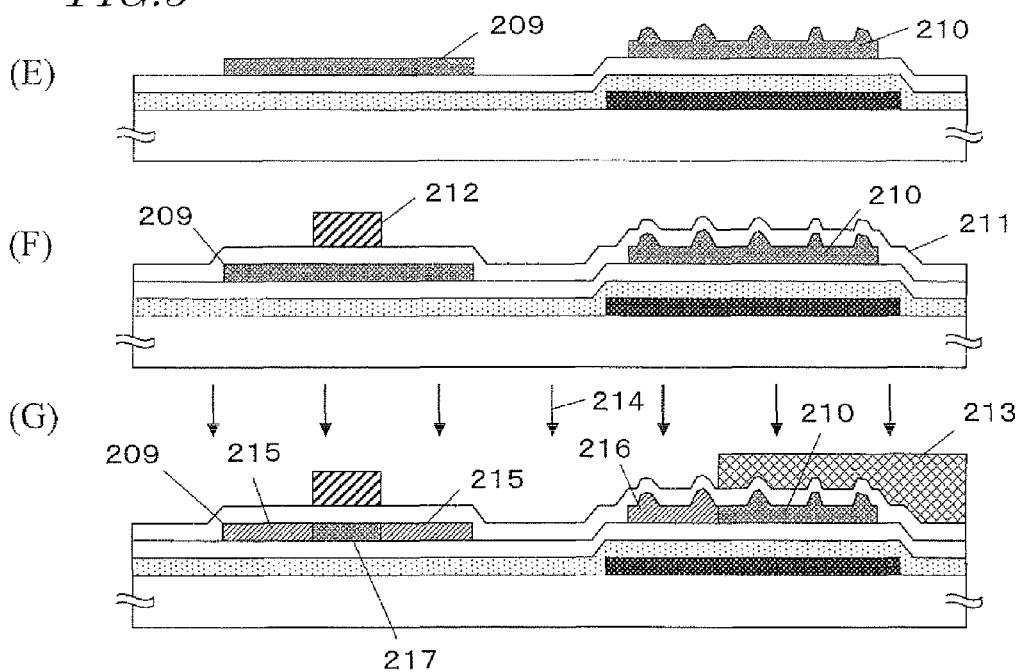
FIGS. 5(E) through 5(G) are schematic cross-sectional views illustrating respective manufacturing process steps to fabricate a semiconductor device according to a second preferred embodiment of the present invention.

Thereafter, as shown in FIG. 5(E), the silicon dioxide layer 207 is removed and then a semiconductor layer 209 to be the active region of a TFT is formed out of the portion 205b of the crystalline silicon film and a semiconductor layer 210 to be the active region of a TFD is formed out of the portion 205c.

Subsequently, as shown in FIG. 5(F), a gate insulating film 211 is deposited over these semiconductor layers 209 and 210 and then a TFT's gate electrode 212 is formed so as to partially overlap with the semiconductor layer 209. The gate insulating film 211 and the gate electrode 212 are formed just as already described with reference to FIG. 3(E).

Thereafter, as shown in FIG. 5(G), a photoresist mask 913 is formed on the gate insulating film 211 so as to partially cover the semiconductor layer 210, and ions 214 of an n-type dopant (such as phosphorus) are implanted into the semiconductor layers 209 and 210. This ion doping process is performed in the same way and on the same condition as already described with reference to FIG. 3(F). As a result of this process step, source/drain regions 215 are defined in those portions of the semiconductor layer 209 that are not overlapped by the gate electrode 212, while a channel region 217 is defined in the other portion of the semiconductor layer 209 that is overlapped by the gate electrode 212 and that has not been implanted with the phosphorus ions 214. On the other hand, an n-type region 216 is defined in the exposed portion of the semiconductor layer 210 that is not covered with the mask 213.

Figure 6:
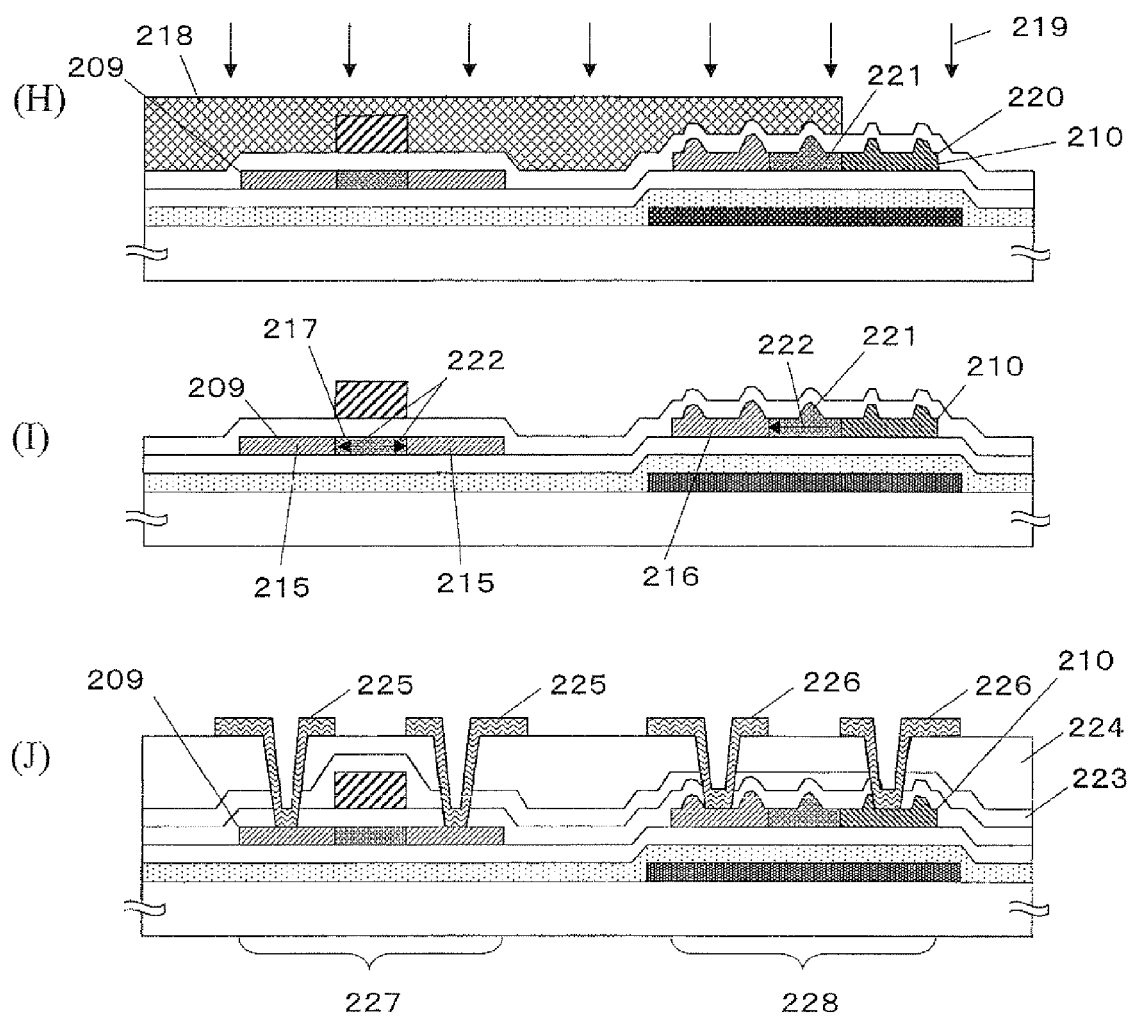
FIGS. 6(H) through 6(J) are schematic cross-sectional views illustrating respective manufacturing process steps to fabricate a semiconductor device according to a second preferred embodiment of the present invention.

Next, the photoresist mask 213 is stripped and then another photoresist mask 218 is formed so as to cover the entire semiconductor layer 209 and a part of the semiconductor layer 210, and ions 219 of a p-type dopant (such as boron) are implanted into the semiconductor layer 210 as shown in FIG. 6(H). This ion doping process is performed in the same way and on the same condition as already described with reference to FIG. 3(G). As a result, a p-type region 220 is defined in that exposed portion of the semiconductor layer 210 that is not covered with the mask 218, while the portion that has been implanted with no boron or phosphorus ions will be an intrinsic region 221.

Thereafter, the mask 218 is removed and then a heat treatment is carried out. By conducting the heat treatment, those portions of the semiconductor layers 209 and 210 that have been implanted with dopant (i.e., phosphorus and boron) ions are activated. In addition, the catalyst element (i.e., nickel in this example) in the channel region 217 and the intrinsic region 221 is moved as indicated by the arrows 222 toward the source/drain regions 215 and the n-type region 216 where there are phosphorus atoms with gettering function as shown in FIG. 6(I). Consequently, the concentrations of nickel in the channel region 217 of the semiconductor layer 209 and in the intrinsic region 221 of the semiconductor layer 210 become lower than in the source/drain regions 215 and the n-type region 216.

In this preferred embodiment, an RTA process is preferably carried out as the heat treatment so that the temperature of the substrate is raised or lowered instantaneously by loading substrates one after another into a high-temperature atmosphere and spraying a high-temperature nitrogen gas against the surface of the substrate. The heat treatment process was carried out at a temperature rise/fall rate exceeding 200° C. per minute (e.g., at 650° C. for 10 minutes). In this process step, any other type of heat treatment may also be carried out. For example, it is naturally possible to carry out a normal heat treatment process using a diffusion furnace or an RTA process that uses a lamp.

Subsequently, as shown in FIG. 6(J), a silicon nitride film 223 and a silicon dioxide film 224 are deposited in this order as interlevel dielectric films by plasma CVD process. If necessary, a heat treatment process is carried out again at a temperature of 300° C. to 500° C. for 30 minutes to 4 hours to hydrogenate the semiconductor layers. This is a process step for terminating and inactivating dangling bonds, which would deteriorate the characteristics of a TFT, by supplying hydrogen atoms to the interface between the active regions and the gate insulating film. In this preferred embodiment, the heat treatment was conducted at 410° C. for an hour within a nitrogen gas ambient including approximately 3% of hydrogen. Alternatively, the semiconductor layers may also be hydrogenated by plasma hydrogenation process (that uses hydrogen excited by plasma). Next, as already described with reference to FIG. 3(H), contact holes are cut through the interlevel dielectric films 223 and 224 and electrodes and interconnects 225 and 226 are formed. In this manner, a thin-film transistor 227 and a thin-film diode 228 are completed. Optionally, a passivation film may be deposited over the thin-film transistor 227 and the thin-film diode 228.

As in the preferred embodiment described above, the thickness D (nm) of the silicon dioxide layer 207 is also preferably set in this preferred embodiment so that the thickness D and the refractive index n of the silicon dioxide layer 207 and the wavelength λ (nm) of the laser beam satisfy the inequality: $D \leq \lambda/(4 \times n) \times 0.5$. Then, the crystalline silicon films 205b and 205c can have substantially the same crystal state and their only major difference should be their surface roughness. In this preferred embodiment, the silicon dioxide film has a refractive index n of 1.46 and the laser beam has a wavelength λ of 308 nm. That is why the silicon dioxide layer 207 preferably has a thickness D of 26 nm or less.

Since the semiconductor device of this preferred embodiment is fabricated by such a method, the semiconductor layer 210 of the thin-film diode 228 can have a greater surface roughness than the semiconductor layer 209 of the thin-film transistor 227. Therefore, the thin-film diode 228 for use as a photosensor TFD reflects much less incoming light from the semiconductor layer 210 and comes to have increased sensitivity to the light. As a result, the bright current increases and the brightness to darkness ratio, which is represented by an SNR, can be increased. In the thin-film transistor 227, on the other hand, the semiconductor layer 209 has a relatively small surface roughness. That is why the reliability can be increased in terms of the breakdown voltage of the gate insulating film and the gate bias stress, and the field effect mobility can be increased, too. Thus, according to this preferred embodiment, the respective semiconductor layers 209 and 210 of the thin-film transistor 227 and the thin-film diode 228 can have quite different surface roughness values only with no significantly different degrees of crystallinity. As a result, the performances of these components can be optimized according to their requirements.

Furthermore, according to this preferred embodiment, the semiconductor layers 209 and 210 are crystalline semiconductor layers that have been crystallized with a catalyst element. For that reason, the semiconductor device of this preferred embodiment will achieve even better transistor performance than the first preferred embodiment will. Therefore, if a circuit is formed using this thin-film diode 228, its circuit components can be integrated together even more densely and the overall circuit size can be further reduced. On the other hand, if the thin-film diode 228 is used as a pixel switching element in a display device, the aperture ratio of the pixel section can be increased.

Embodiment 3

Hereinafter, a third preferred embodiment of a semiconductor device according to the present invention will be described with reference to the accompanying drawings. The semiconductor device of this preferred embodiment has the same configuration as the counterpart of the first preferred embodiment (see FIG. 1). According to this preferred embodiment, however, the manufacturing process is further simplified by using a special opaque layer pattern, which is a major difference from the first preferred embodiment described above.

Figure 7:
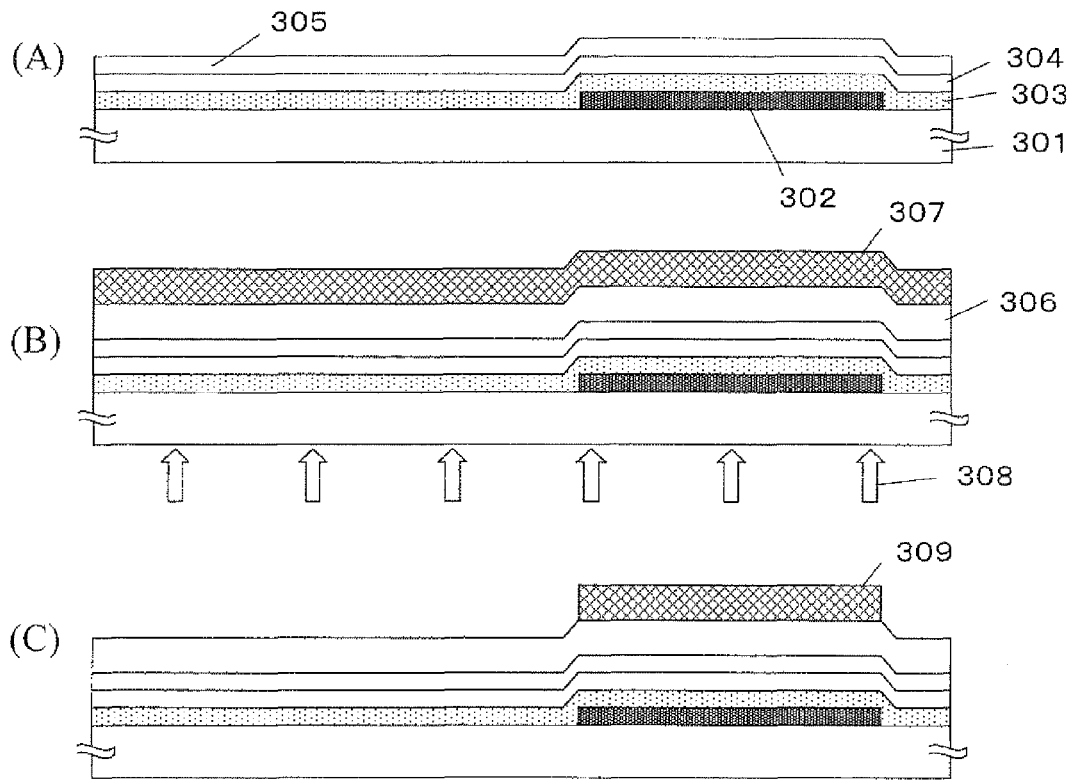
FIGS. 7(A) through 7(C) are schematic cross-sectional views illustrating respective manufacturing process steps to fabricate a semiconductor device according to a third preferred embodiment of the present invention.

First of all, as shown in FIG. 7(A), an opaque layer 302 is formed as a special pattern on a substrate 301 and then a silicon nitride film 303 and a silicon dioxide film 304 are stacked thereon in this order as undercoat films. After that, an amorphous silicon film 305 is deposited on them. These layers and films are formed just as already described with reference to FIG. 2(A).

Subsequently, as shown in FIG. 7(B), a silicon dioxide film 306 is deposited to a thickness of 20 nm, for example, on the amorphous silicon film 305 by plasma CVD process, and then coated with a photoresist 307. Then, the photoresist 307 is exposed to radiation 308 that has come from under the back surface of the substrate 301. In this case, a portion of the photoresist 307 that is masked with the opaque layer 302 is not exposed to the radiation.

When the photoresist 307 that has been exposed to the radiation is developed, a photoresist mask 309 having the same pattern as the opaque layer 302 is obtained as shown in FIG. 7(C).

Figure 8:
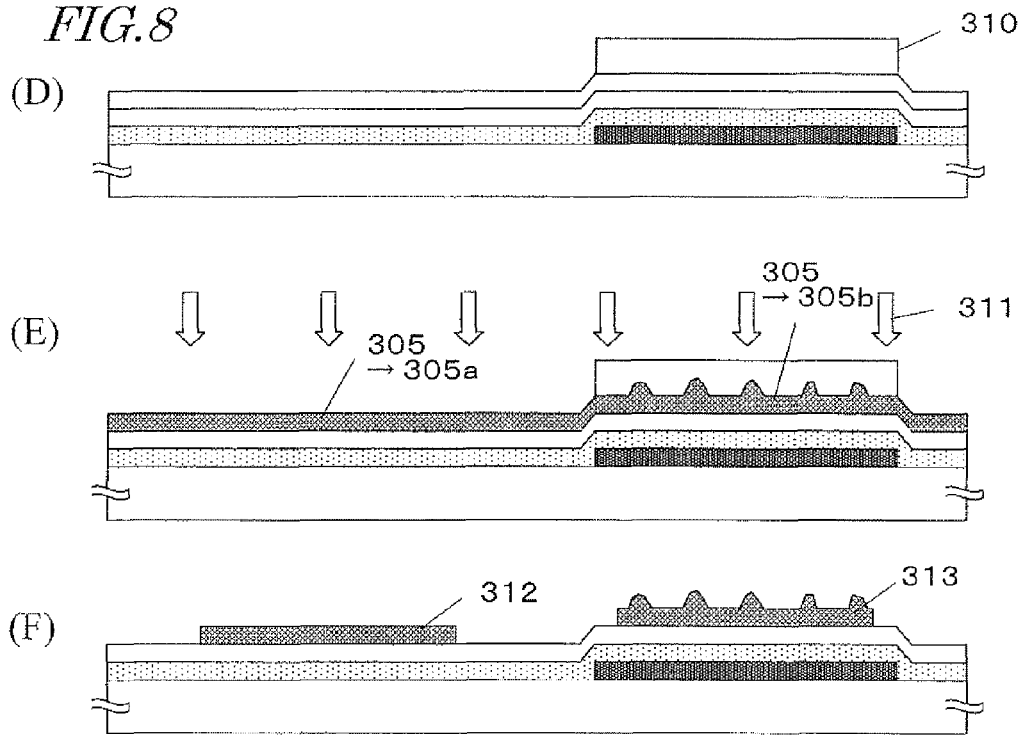
FIGS. 8(D) through 8(F) are schematic cross-sectional views illustrating respective manufacturing process steps to fabricate a semiconductor device according to a third preferred embodiment of the present invention.

Next, as shown in FIG. 8(D), the silicon dioxide film 306 is patterned with the photoresist mask 309, thereby forming an island 310 of silicon dioxide in the same pattern as the opaque layer's 302. After that, the photoresist mask 309 is stripped.

Thereafter, as shown in FIG. 8(E), a laser beam 311 is radiated from over the silicon dioxide layer 310. In this process step, an XeCl excimer laser beam with a wavelength of 308 nm is used as the laser beam 311. The sizes of the laser beam spot 311 are determined so that an elongated beam spot is formed on the surface of the substrate 301. And by sequentially scanning the surface of the substrate 301 perpendicularly to the direction in which the beam spot is elongated, the amorphous silicon film 305 gets crystallized over the entire surface of the substrate to be a crystalline silicon film. A portion 305b of the crystalline silicon film that is covered with the silicon dioxide layer 310 comes to have a greater surface roughness than the other portion 305a thereof that is not covered with the silicon dioxide layer 310. It should be noted that these portions 305a and 305b have substantially the same degrees of crystallinity and almost the same crystal grain size.

Before the amorphous silicon film 305 is irradiated with the laser beam 311, a natural oxide film is preferably removed from its portion that is not covered with the silicon dioxide layer 310 as in the preferred embodiments described above. Also, it is more preferred that the laser beam 311 be radiated within an inert gas atmosphere such as nitrogen gas ambient because the surface roughness of the region 305a can be further reduced in that case.

Subsequently, the silicon dioxide layer 310 is stripped and then a semiconductor layer 312 to define the active region of a TFT is formed out of the portion 305a of the crystalline silicon film and a semiconductor layer 313 to define the active region of a TFD is formed out of the portion 305b as shown in FIG. 8(F).

After that, although not shown, a TFT and a TFD are fabricated using the semiconductor layers 312 and 313, respectively, just as already described for the first preferred embodiment with reference to FIGS. 3(E) to 3(H).

According to this preferred embodiment, the effects of the first preferred embodiment described above are also achieved. On top of that, since the oxide film (e.g., silicon dioxide film) 306 for use to make the surface roughness of the crystalline silicon film locally different is patterned by performing a backside exposure process using the opaque layer 302 with a special pattern, the number of manufacturing process steps can be reduced. Specifically, the number of photomasks to use can be reduced by one compared to the method of the first preferred embodiment. Consequently, the effects of the present invention can be achieved without significantly increasing the number of manufacturing process steps compared to the conventional process.

Embodiment 4

Hereinafter, a fourth preferred embodiment of the present invention will be described. In a method for fabricating a semiconductor device according to this fourth preferred embodiment, after an amorphous semiconductor film has been irradiated and crystallized with a laser beam in its entirety, only a portion of the resultant crystalline semiconductor film to define the active region of a TFT has its surface planarized, which is a major difference from the first preferred embodiment described above.

According to this preferred embodiment, first off, the entire amorphous silicon film is once crystallized and turned into a crystalline silicon film by irradiating it with a laser beam for the first time. At this point in time, there are ridges substantially uniformly all over the surface of the crystalline silicon film. Subsequently, an oxide layer is formed on only a portion of the crystalline silicon film to define the active region of a TFD and only another portion thereof to define the active region of a TFT is irradiated with a laser beam for the second time. As a result, that portion of the crystalline silicon film that has been irradiated with the laser beam has its surface planarized. It is preferred that the second laser radiation process be performed with the previous crystal state (before it is irradiated with the laser beam for the second time) maintained. In this manner, only surface roughnesses of the TFT's and TFD's semiconductor layers can be different from each other with their degrees of crystallinity kept substantially equal to each other. In addition, since the crystalline silicon film has its surface planarized by being irradiated with the laser beam for the second time, the semiconductor layer thus obtained can have a smaller surface roughness than the TFT's semiconductor layer of the first preferred embodiment described above. Consequently, the TFT's field effect mobility can be further increased and the reliability can be increased, too.

Hereinafter, an example of a manufacturing process according to this preferred embodiment will be described specifically with reference to the accompanying drawings.

Figure 9:
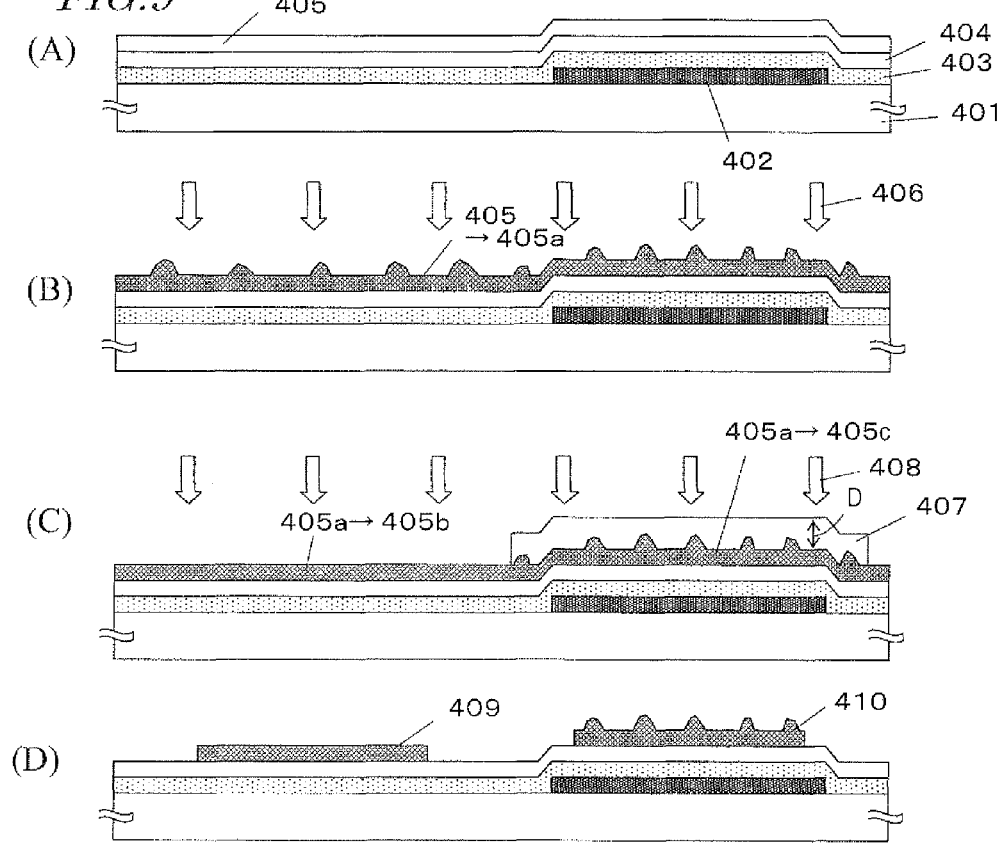
FIGS. 9(A) through 9(D) are schematic cross-sectional views illustrating respective manufacturing process steps to fabricate a semiconductor device according to a fourth preferred embodiment of the present invention.

First of all, as shown in FIG. 9(A), an opaque layer 402 is formed on a substrate 401 and then a silicon nitride film 403 and a silicon dioxide film 404 are deposited thereon in this order as undercoat films. Thereafter, an amorphous semiconductor film (e.g., an amorphous silicon film in this example) 405 is deposited on them. These layers and films are formed just as already described with reference to FIG. 2(A).

Next, the amorphous silicon film 405 is irradiated and crystallized with a laser beam 406 that has come from over the substrate 401, thereby obtaining a crystalline silicon film 405a (which is the first laser radiation process). As shown in FIG. 9(B), on the surface of the crystalline silicon film 405a, there are ridges that have been produced while the amorphous silicon film 405 is melting and solidifying.

Before irradiated with the laser beam 406, the amorphous silicon film 405 preferably has its surface thinly oxidized with ozone water, for example. As a result, a crystalline silicon film 405a with a greater surface roughness and good crystallinity (e.g., which has a bigger crystal grain size) can be obtained. The thin oxidation process may be performed simply by washing the surface of the amorphous silicon film 405 with ozone water, for example. Also, the laser beam 406 is preferably radiated within an atmosphere including oxygen. Then, the degree of crystallinity (or the crystal grain size) of the crystalline semiconductor film 405a can be further increased.

Subsequently, as shown in FIG. 9(C), an island of an oxide (e.g., silicon dioxide layer) 407 is formed on a portion of the crystalline silicon film 405a to define the active region of a TFD. The silicon dioxide layer 407 may also be formed by depositing and patterning a silicon dioxide film just as already described with reference to FIG. 2(B). Alternatively, the silicon dioxide film may also be patterned by performing a self-aligning process using the pattern of the opaque layer 402 as already described with reference to FIGS. 7(B) through 8(D). The silicon dioxide layer 407 may have a thickness of 20 nm, for example.

In such a state, the crystalline silicon film 405a is irradiated for the second time with a laser beam 408 that has come from over the substrate 401. As a result, a portion of the crystalline silicon film 405a that is not covered with the silicon dioxide layer 407 comes to have a decreased surface roughness and is planarized. On the other hand, another portion 405c thereof that is covered with the silicon dioxide layer 407 maintains the surface roughness that was produced there by the first laser radiation process. Or depending on the radiation energy of the laser beam 408, the silicon dioxide layer 407 could achieve the same effect as the oxide layer of the first preferred embodiment described above, and therefore, could further increase the surface roughness of that portion 405c.

In this preferred embodiment, an XeCl excimer laser beam with a wavelength of 308 nm is used as the laser beam 408. The sizes of the laser beam spot 408 are determined so that an elongated beam spot is formed on the surface of the substrate 401. And by sequentially scanning the surface of the substrate 401 perpendicularly to the direction in which the beam spot is elongated, the amorphous silicon film 405 is irradiated with the laser beam 408 over the entire surface of the substrate. The radiation energy of the laser beam 408 that is radiated in this process step for the purpose of planarization is set to be equal to or higher than that of the laser beam that is radiated for the first time for the purpose of crystallization. If the former radiation energy were lower than the latter, the planarization effect would be insufficient. But if the radiation energy were too high to the contrary, the degree of crystallinity that was obtained by the first laser radiation process would be reset. That is why the radiation energy of this second laser radiation process is preferably higher than the first time around by +0 mJ/cm$^2$ to +30 mJ/cm$^2$.

As in the preferred embodiments described above, the thickness D (nm) of the silicon dioxide layer 407 is also preferably set in this preferred embodiment so that the thickness D and the refractive index n of the silicon dioxide layer 407 and the wavelength $\lambda$ (nm) of the laser beam satisfy the inequality: $D \leq \lambda/(4 \times n) \times 0.5$ Then, the antireflection effect of the silicon dioxide layer 407 can be reduced and the influence of the second laser radiation process on the crystallinity can be minimized. As a result, those portions 405b and 405c of the crystalline silicon film can have substantially the same crystal state and their only major difference should be their surface roughness. In this preferred embodiment, the silicon dioxide film has a refractive index n of 1.46 and the laser beam has a wavelength $\lambda$ of 308 nm. That is why the silicon dioxide layer 407 preferably has a thickness D of 26 nm or less.

It is preferred that before the crystalline silicon film 405a is irradiated with the laser beam 408 for the second time, a natural oxide film be removed from that exposed portion of the crystalline silicon film 405a that is not covered with the silicon dioxide layer 407. Then, the surface roughness of that portion 405b can be further reduced. It is even more preferred that the laser beam 408 be radiated for the second time in an inert atmosphere such as nitrogen gas ambient because the surface roughness of the portion 405b can be further reduced in that case.

Also, in this process step, the energy density of the laser beam 408 is preferably defined to be not too high to avoid resetting the crystal state of the crystalline silicon film 405a completely. Then, both of those portions 405b and 405c can have substantially equal and increased degrees of crystallinity.

Subsequently, the silicon dioxide layer 407 is removed and then the crystalline silicon film is split into islands, thereby forming semiconductor layers 409 and 410 to be TFT's and TFD's active regions out of those portions 405b and 405c, respectively, as shown in FIG. 9(D).

After that, although not shown, a TFT and a TFD (photosensor TFD) are fabricated using the semiconductor layers 409 and 410, respectively, just as already described for the first preferred embodiment with reference to FIGS. 3(E) to 3(H).

According to this preferred embodiment, the effects of the first preferred embodiment described above are also achieved. Specifically, the photosensor TFD reflects much less incoming light from the surface of the semiconductor layer 410 and comes to have increased sensitivity to the light. As a result, the bright current increases and the brightness to darkness ratio, which is represented by an SNR, can be increased. In the TFT, on the other hand, the semiconductor layer 409 has a planarized surface. That is why the reliability can be increased in terms of the breakdown voltage of the gate insulating film and the gate bias stress, and the field effect mobility can be increased, too. As a result, the performances of the TFT and TFD can be optimized according to their requirements.

Also, unlike the first preferred embodiment, a crystalline silicon film 405a with great surface roughness and good crystallinity is once formed and then only a necessary part of it is planarized in this preferred embodiment. According to such a method, a crystalline silicon film 405a with a uniform degree of crystallinity is formed over the entire substrate 401 by the first laser radiation process and then patterned into the TFT's and TFD's semiconductor layers 409 and 410. Consequently, the degrees of crystallinity of these semiconductor layers 409 and 410 can be controlled to be substantially equal to each other. On top of that, the degree of crystallinity and the surface roughness, which are two important parameters, can be controlled in two different process steps. That is why the manufacturing process and the product quality can be controlled easily, which is also beneficial.

Thus, according to this preferred embodiment, the respective semiconductor layers 409 and 410 of the TFT and the TFD can have quite different surface roughness values only with their crystal states substantially equalized with each other. As a result, the performances of these components can be even closer to the required ones.

The surface roughness values of these semiconductor layers 409 and 410 are not particularly limited. For example, if the semiconductor layers 409 and 410 are formed out of an amorphous silicon film with a thickness of 50 nm, the semiconductor layer 409 to define a TFT's active region may have an arithmetic average roughness Ra of 1-3 nm and a maximum height Rz of 10-20 nm, while the semiconductor layer 410 to define a TFD's active region may have an arithmetic average roughness Ra of 6-10 nm and a maximum height Rz of 60-100 nm. If the semiconductor layers 409 and 410 have surface roughness values falling within these ranges, the photosensitivity (as represented by a bright current value) of the TFD made of the semiconductor layer 410 will be approximately 1.5 times as high as that of a thin-film diode, of which the surface roughness of the semiconductor layer is as high as that of the TFT.

Embodiment 5

Hereinafter, a fifth preferred embodiment of the present invention will be described. In a method for fabricating a semiconductor device according to this fifth preferred embodiment, a crystalline semiconductor film that has been crystallized with a catalyst element is irradiated and re-crystallized in its entirety with a laser beam and only a portion of the re-crystallized crystalline semiconductor film to define a TFT's active region has its surface planarized unlike the manufacturing process of the second preferred embodiment described above.

According to this preferred embodiment, first off, an amorphous silicon film is crystallized in solid phase using a catalyst element to obtain a first crystalline silicon film. After that, the first crystalline silicon film is irradiated with a laser beam for the first time so as to be re-crystallized once in its entirety. A second crystalline silicon film thus obtained has substantially uniform crystallinity and also has ridges all over its surface. Subsequently, only a portion of the second crystalline silicon film to define a TFT's active region is irradiated with a laser beam for the second time so as to be planarized. It is preferred that the second laser radiation process be performed with the previous crystal state (before it is irradiated with the laser beam for the second time) maintained. In this manner, only surface roughnesses of the TFT's and TFT's semiconductor layers can be different from each other with their degrees of crystallinity kept substantially equal to each other. In addition, since the crystalline silicon film has its surface planarized by being irradiated with the laser beam for the second time, the semiconductor layer thus obtained can have a smaller surface roughness than the TFT's semiconductor layer of the second preferred embodiment described above. Consequently, the TFT's field effect mobility can be further increased and the reliability can be increased, too.

Hereinafter, an example of a manufacturing process according to this preferred embodiment will be described specifically with reference to the accompanying drawings.

Figure 10:
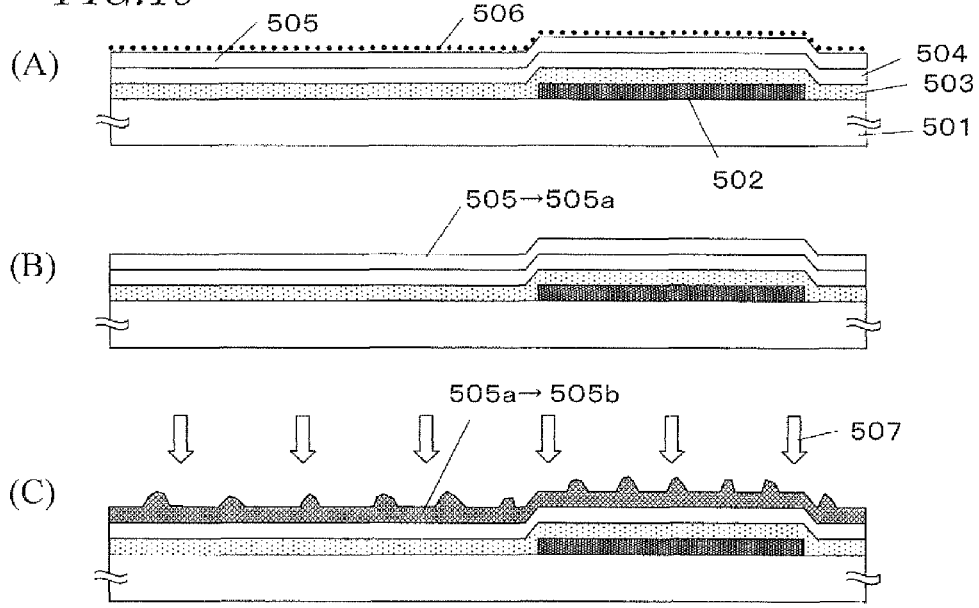
FIGS. 10(A) through 10(C) are schematic cross-sectional views illustrating respective manufacturing process steps to fabricate a semiconductor device according to a fifth preferred embodiment of the present invention.

First of all, as shown in FIG. 10(A), an opaque layer 502 is formed as a special pattern on a substrate 501 and then a silicon nitride film 503 and a silicon dioxide film 504 are stacked thereon in this order as undercoat films. After that, an amorphous semiconductor film (e.g., amorphous silicon film) 505 is deposited on them and a catalyst element (e.g., nickel in this example) 506 is added to its surface. The opaque layer 502, the undercoat films 503 and 504 and the amorphous silicon film 505 are formed, and nickel 506 is added, just as already described with reference to FIG. 4(A).

Next, as shown in FIG. 10(B), the amorphous silicon film 505 is heated, thereby producing a solid-phase crystallization in the amorphous silicon film 505 using the nickel 506 as a nucleus. The heat treatment may be carried out just as already described with reference to FIG. 4(B). In this manner, a first crystalline silicon film 505a can be obtained.

Next, as shown in FIG. 10(C), the first crystalline silicon film 505a is irradiated for the first time with a laser beam 507 that has come from over the substrate 501. As a result of this process step, the first crystalline silicon film 505a is re-crystallized to be a second crystalline silicon film 505b of even higher quality. Ridges have been produced all over the surface of the second crystalline silicon film 505b. An XeCl excimer laser beam with a wavelength of 308 nm may be used as the laser beam 507. The sizes of the laser beam spot 507 are determined so that an elongated beam spot is formed on the surface of the substrate 501. And by sequentially scanning the surface of the substrate 501 perpendicularly to the direction in which the beam spot is elongated, the first crystalline silicon film 505a gets re-crystallized over the entire surface of the substrate.

Before irradiated with the laser beam 507, the crystalline silicon film 505a preferably has its surface thinly oxidized with ozone water, for example. As a result, a crystalline silicon film 505b with a greater surface roughness and good crystallinity (e.g., which has a bigger crystal grain size) can be obtained. The thin oxidation process may be performed simply by washing the surface of the crystalline silicon film 505a with ozone water, for example. Also, the laser beam 507 is preferably radiated within an atmosphere including oxygen. Then, the degree of crystallinity (or the crystal grain size) of the crystalline semiconductor film 505b can be further increased.

Figure 11:
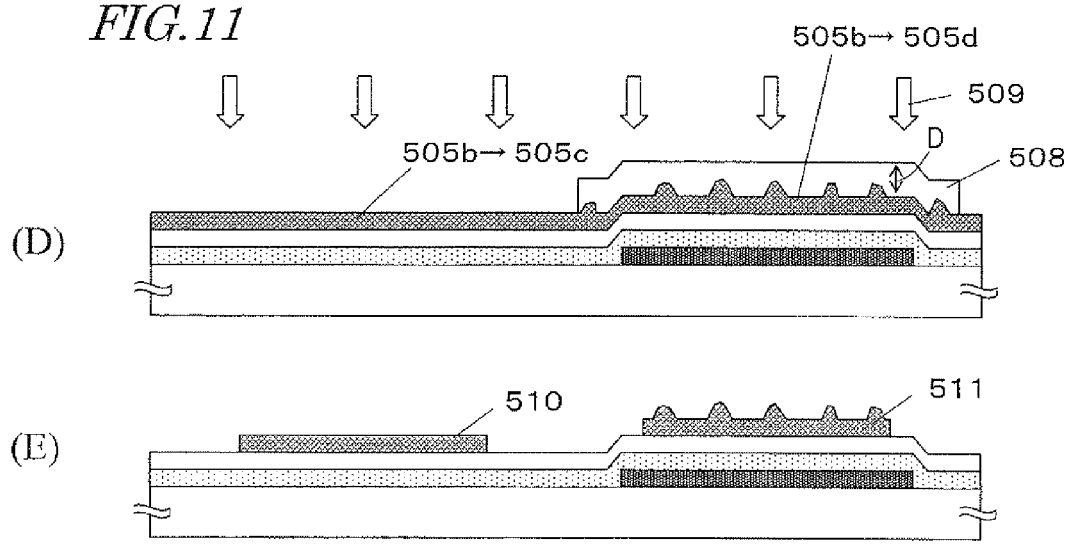
FIGS. 11(D) and 11(E) are schematic cross-sectional views illustrating respective manufacturing process steps to fabricate a semiconductor device according to a fifth preferred embodiment of the present invention.

Subsequently, as shown in FIG. 11(D), an island of an oxide (e.g., silicon dioxide layer) 508 is formed on portion of the second crystalline silicon film 505b to define the active region of a TFD. The silicon dioxide layer 508 has a thickness D of 20 nm and may also be formed by depositing and patterning a silicon dioxide film just as already described with reference to FIG. 2(B). Alternatively, the silicon dioxide film may also be patterned by performing a self-aligning process using the pattern of the opaque layer 502 as already described with reference to FIGS. 7(B) through 8(D).

In such a state, the crystalline silicon film 505b is irradiated for the second time with a laser beam 509 that has come from over the substrate 501. As a result, a portion of the crystalline silicon film 505b that is not covered with the silicon dioxide layer 508 comes to have a decreased surface roughness and is planarized. On the other hand, another portion 505d thereof that is covered with the silicon dioxide layer 508 either maintains the surface roughness that was produced there by the first laser radiation process or a further increased surface roughness depending on the radiation energy of the laser beam 509.

The radiation energy of the laser beam 509 that is radiated in this process step for the purpose of planarization is set to be equal to or higher than that of the laser beam that is radiated for the first time. If the former radiation energy were lower than the latter, the planarization effect would be insufficient. But if the radiation energy were too high to the contrary, the degree of crystallinity that was obtained by the first laser radiation process would be reset. That is why the radiation energy of this second laser radiation process is preferably higher than the first time around by $+0 \, mJ/cm^2$ to $+30 \, mJ/cm^2$.

In this preferred embodiment, an XeCl excimer laser beam with a wavelength of 308 nm is used as the laser beam 509. The sizes of the laser beam spot 509 are determined so that an elongated beam spot is formed on the surface of the substrate 501. And by sequentially scanning the surface of the substrate 501 perpendicularly to the direction in which the beam spot is elongated, the crystalline silicon film 505$b$ is irradiated with the laser beam 509 over the entire surface of the substrate.

As in the preferred embodiments described above, the thickness D (nm) of the silicon dioxide layer 508 is also preferably set in this preferred embodiment so that the thickness D and the refractive index n of the silicon dioxide layer 508 and the wavelength $\lambda$ (nm) of the laser beam satisfy the inequality: $D \leq \lambda/(4 \times n) \times 0.5$. Then, the antireflection effect of the silicon dioxide layer 508 can be reduced and the influence of the second laser radiation process on the crystallinity can be minimized. As a result, those portions 505$c$ and 505$d$ of the crystalline silicon film can have substantially the same crystal state and their only major difference should be their surface roughness. In this preferred embodiment, the silicon, dioxide film has a refractive index n of 1.46 and the laser beam has a wavelength $\lambda$ of 308 nm. That is why the silicon dioxide layer 508 preferably has a thickness D of 26 nm or less.

It is preferred that before the crystalline silicon film 505$b$ is irradiated with the laser beam 509 for the second time, a natural oxide film be removed from that exposed portion of the crystalline silicon film 505$b$ that is not covered with the silicon dioxide layer 508. Then, the surface roughness of that portion 505$c$ can be further reduced. It is even more preferred that the laser beam 509 be radiated for the second time in an inert atmosphere such as nitrogen gas ambient because the surface roughness of the portion 505$c$ can be further reduced in that case.

Also, in this process step, the energy density of the laser beam 509 is preferably defined to be not too high to avoid resetting the crystal state of the crystalline silicon film 505$b$ completely. Then, both of those portions 505$c$ and 505$d$ can have substantially equal and increased degrees of crystallinity.

Subsequently, the silicon dioxide layer 508 is removed and then the crystalline silicon film is split into islands, thereby forming semiconductor layers 510 and 511 to be TFT's and TFD's active regions out of those portions 505$c$ and 505$d$, respectively, as shown in FIG. 11(E).

After that, although not shown, a TFT and a TFD (photosensor TFD) are fabricated using the semiconductor layers 510 and 511, respectively, just as already described for the second preferred embodiment with reference to FIGS. 5(F) to 6(J).

According to this preferred embodiment, the effects of the second preferred embodiment described above are also achieved. Specifically, the photosensor TFD reflects much less incoming light from the surface of the semi conductor layer 511 and comes to have increased sensitivity to the light.

As a result, the bright current increases and the brightness to darkness ratio, which is represented by an SNR, can be increased. In the TFT, on the other hand, the semiconductor layer 510 has a planarized surface. That is why the reliability can be increased in terms of the breakdown voltage of the gate insulating film and the gate bias stress, and the field effect mobility can be increased, too. As a result, the performances of the TFT and TFD can be optimized according to their requirements. Furthermore, according to this preferred embodiment, the semiconductor layers 510 and 511 are crystalline semiconductor layers that have been crystallized with a catalyst element. For that reason, the semiconductor device of this preferred embodiment will achieve even better transistor performance than the first preferred embodiment will. Therefore, if a circuit is formed using the TFT of this preferred embodiment, its circuit components can be integrated together even more densely and the overall circuit size can be further reduced. On the other hand, if the TFT of this preferred embodiment is used as a pixel switching element in a display device, the aperture ratio of the pixel section can be increased.

Also, unlike the second preferred embodiment, a crystalline silicon film 505$b$ with great surface roughness (because it has ridges) and good crystallinity is once formed and then only a necessary part of it is planarized in this preferred embodiment. According to such a method, a crystalline silicon film 505$b$ with a uniform degree of crystallinity is formed over the entire substrate 501 by the first laser radiation process and then patterned into the TFT's and TFD's semiconductor layers 510 and 511. Consequently, the degrees of crystallinity of these semiconductor layers 510 and 511 can be controlled to be substantially equal to each other. On top of that, the degree of crystallinity and the surface roughness, which are two important parameters, can be controlled in two different process steps. That is why the manufacturing process and the product quality can be controlled easily, which is also beneficial.

Thus, according to this preferred embodiment, the respective semiconductor layers 510 and 511 of the TFT and the TFD can have quite different surface roughness values only with their crystal states substantially equalized with each other. As a result, the performances of the TFT and TFD can be even closer to the required ones.

Embodiment 6

Hereinafter, a sixth preferred embodiment of a semiconductor device according to the present invention will be described. As for the first through fifth preferred embodiments of the present invention, it has been described how to fabricate a semiconductor device with the simplest structure (more specifically, how to fabricate an n-channel TFT and a photosensor TFD on the same substrate) to let the reader easily understand basically how this invention works. But in the following description, it will be described how to fabricate a semiconductor device that includes a number of TFTs and TFDs with different conductivity types or configurations on the same substrate and that is applicable to an electronic device with a photosensor section and a display section.

The semiconductor device of this preferred embodiment is applicable to an active-matrix substrate for a display device with a photosensor function and includes a circuit section with a number of TFTs, a pixel section with a lot of pixels (which will be also referred to herein as a "display area") and a photosensor section with photosensor TFDs on the same substrate.

The circuit section includes n-channel TFTs and p-channel TFTs. In this preferred embodiment, a TFT with a GOLD (gate overlapped LDD) structure, which will achieve high reliability against hot carrier deterioration, is used as an n-channel TFT. As for a p-channel TFT, on the other hand, a TFT with no LDD regions, i.e., a so-called "TFT with a single drain structure", is used.

The pixel section includes a number of TFTs (pixel TFTs), each of which is provided for an associated one of the pixels and which functions as a switching element, and storage capacitors connected to those TFTs. As the pixel TFT, used is a TFT with an LDD structure, which has an LDD region that is offset from the gate electrode toward the source/drain regions in order to reduce OFF-state current. Also, to disperse the voltage applied between the source/drain regions and reduce the OFF-state current even more effectively, the TFT preferably has a dual gate structure in which two gate electrodes are arranged in series with each other with respect to a single semiconductor layer.

According to this preferred embodiment, the TFT's and TFD's semiconductor layers (i.e., their active regions) are formed out of a crystalline semiconductor film obtained by crystallizing the same amorphous semiconductor film. Also, in the step of crystallizing the amorphous semiconductor film or in the step of planarizing the crystalline semiconductor film, a portion of the crystalline semiconductor film to be a photosensor TFD's semiconductor layer is made to have a greater surface roughness than any other region. That is why the n-channel TFT's semiconductor layer, the p-channel TFT's semiconductor layer, the pixel TFT's semiconductor layer and the semiconductor layer to be the lower electrode of a storage capacitor section all have a smaller surface roughness than the photosensor TFD's semiconductor layer.

Such semiconductor layers with different surface roughness values may be formed by any of the methods of the first through fifth preferred embodiments of the present invention described above. In the following description, it will be described specifically how to fabricate such a semiconductor device by the method of the fourth preferred embodiment described above (see FIG. 9).

Figure 12:
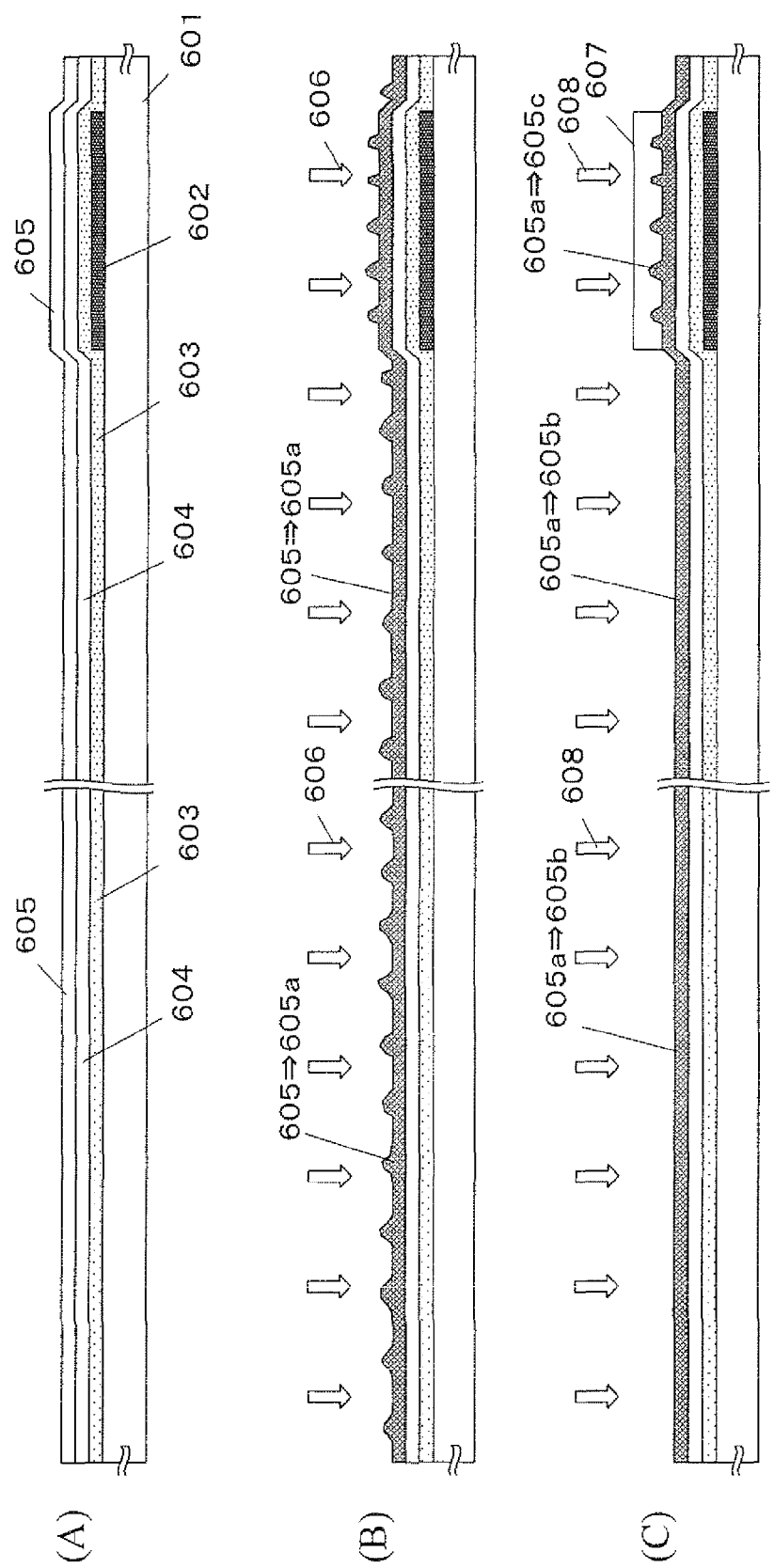
FIGS. 12(A) through 12(C) are schematic cross-sectional views illustrating respective manufacturing process steps to fabricate a semiconductor device according to a sixth preferred embodiment of the present invention.

First of all, as shown in FIG. 12(A), an opaque layer 602 with a particular pattern is formed on a substrate 601 and then a silicon nitride film 603 and a silicon dioxide film 604 are deposited thereon in this order as undercoat films. Thereafter, an amorphous semiconductor film (e.g., an amorphous silicon film in this example) 605 is deposited on them. These layers and films are formed just as already described with reference to FIG. 2(A).

Next, as shown in FIG. 12(B), the amorphous silicon film 605 is irradiated and crystallized with a laser beam 606 that has come from over the substrate 601, thereby obtaining a crystalline silicon film 605a (which is the first laser radiation process). As shown in FIG. 12(B), ridges have been produced uniformly all over the surface of the crystalline silicon film 605a. This first laser radiation process is performed in the same way and on the same condition as already described for the fourth preferred embodiment with reference to FIG. 9(B).

Before irradiated with the laser beam 606, the amorphous silicon film 605 also preferably has its surface thinly oxidized with ozone water, for example, as in the fourth preferred embodiment described above. Also, the laser beam 606 is preferably radiated within an atmosphere including oxygen. Then, the degree of crystallinity (or the crystal grain size) of the crystalline semiconductor film 605a can be further increased.

Subsequently, as shown in FIG. 12(C), an island of an oxide (e.g., silicon dioxide layer) 607 is formed only on a portion of the crystalline silicon film 605a to define the active region of a TFD. The silicon dioxide layer 607 may also be formed by depositing and patterning a silicon dioxide film over the entire surface of the substrate 601. Alternatively, the silicon dioxide film may also be patterned by performing a backside exposure process using the pattern of the opaque layer 602 as already described with reference to FIGS. 7(B) through 8(D). The silicon dioxide layer 607 may have a thickness of 20 nm, for example.

In such a state, the crystalline silicon film 605a is irradiated for the second time with a laser beam 608 that has come from over the substrate 601. As a result, a portion of the crystalline silicon film 605a that is not covered with the silicon dioxide layer 607 turns into a planarized region 605b with decreased surface roughness. On the other hand, another portion 605c thereof that is covered with the silicon dioxide layer 607 maintains the surface roughness that was produced there by the first laser radiation process. Or depending on the radiation energy of the laser beam 608, the portion 605c could have further increased surface roughness, which is greater than that of the portion 605b.

In this preferred embodiment, an XeCl excimer laser beam with a wavelength of 308 nm is used as the laser beam 608. The sizes of the laser beam spot 608 are determined so that an elongated beam spot is formed on the surface of the substrate 601. And by sequentially scanning the surface of the substrate 601 perpendicularly to the direction in which the beam spot is elongated, the amorphous silicon film 605 is irradiated with the laser beam 608 over the entire surface of the substrate.

As in the fourth preferred embodiment described above, is also preferred that before the crystalline silicon film 605a is irradiated with the laser beam 608 for the second time, a natural oxide film be removed from that exposed portion of the crystalline silicon film 605a that is not covered with the silicon dioxide layer 607. Then, the surface roughness of that portion 605b can be further reduced. It is even more preferred that the laser beam 608 be radiated for the second time in an inert atmosphere such as nitrogen gas ambient because the surface roughness of the portion 605b can be further reduced in that case.

Figure 13:
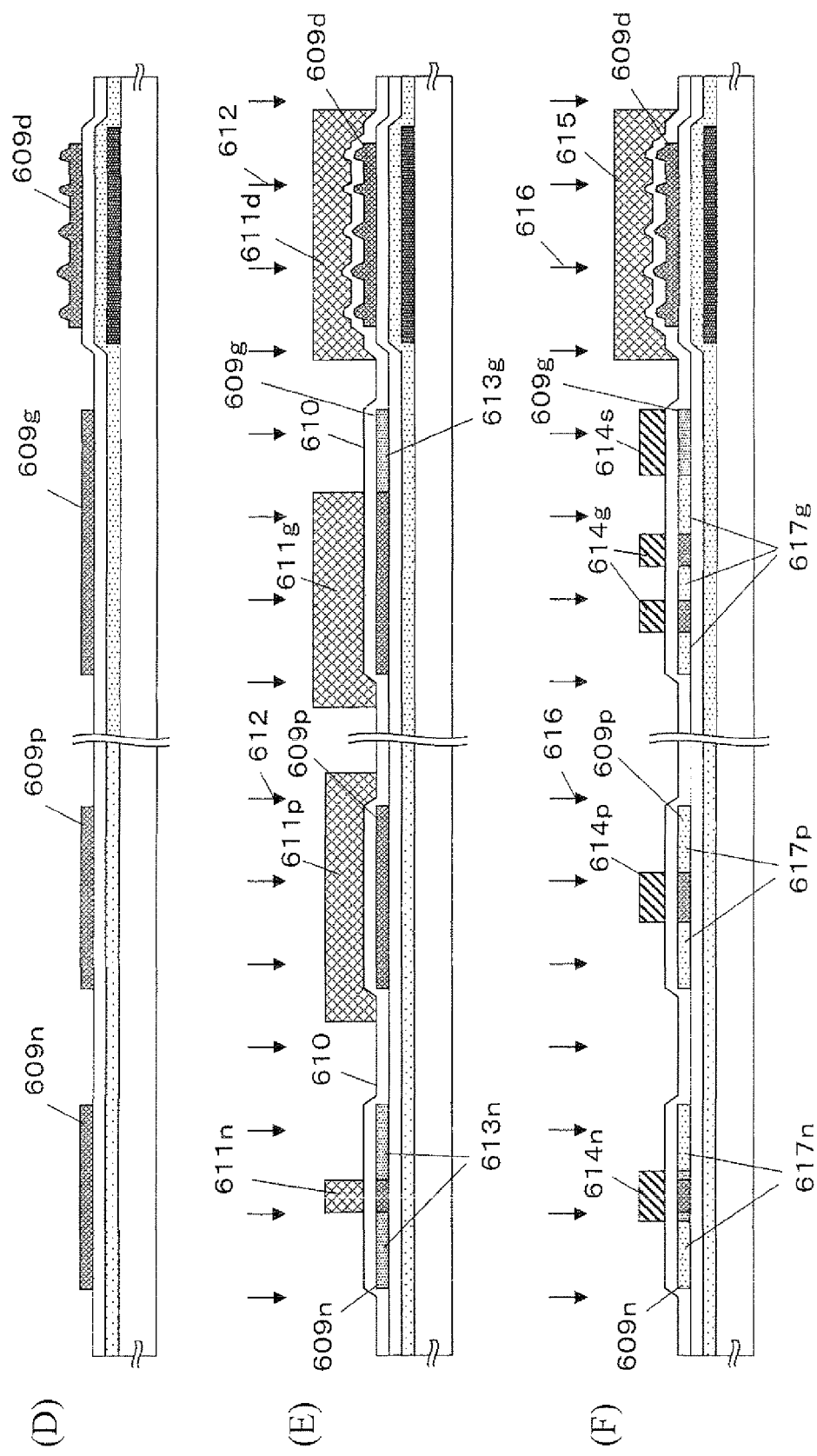
FIGS. 13(D) through 13(F) are schematic cross-sectional views illustrating respective manufacturing process steps to fabricate a semiconductor device according to a sixth preferred embodiment of the present invention.

Thereafter, the silicon dioxide layer 607 is removed, and then the portion 605b of the crystalline silicon film is patterned into a semiconductor layer 609n to be an n-channel TFT's active region, a semiconductor layer 609p to be a p-channel TFT's active region, a semiconductor layer to be a pixel TFT's active region, and a semiconductor layer 609g to be the lower electrode of a storage capacitor as shown in FIG. 13(D). On the other hand, the portion 605c is patterned into a semiconductor layer 609d to be a photosensor TFD's active region.

Subsequently, as shown in FIG. 13(E), a gate insulating film 610 is deposited over these semiconductor layers 609n, 609p, 609g and 609d. Thereafter, doping masks 611n, 611p, 611g and 611d of photoresist are defined on the gate insulating film 610. Specifically, the doping mask 611n is arranged to cover a portion of the semiconductor layer 609n to be a channel region. The doping mask 611g is arranged so as to cover the semiconductor layer 609g entirely except its portion to be a storage capacitor. And the doping masks 611p and 611d are arranged so as to cover the semiconductor layers 609p and 609d entirely.

In such a state, exposed portions of the semiconductor layers 609n and 609g, which are not covered with the doping masks 611n and 611g, are lightly doped with a first n-type dopant (phosphorus) 612. In this process step, phosphine ($PH_3$) is used as a doping gas, the acceleration voltage is set within the range of 60 to 90 kV (e.g., 70 kV), and the dose is set within the range of $1\times10^{12}$ to $1\times10^{14}$ cm$^{-2}$ (e.g., $2\times10^{13}$ cm$^{-2}$). As a result, a first set of n-type lightly doped regions 613n and 613g are defined in that portion of the semiconductor layer 609n that will be an re-channel TFT's active region (including source/drain regions and an LDD region) and in that portion of the semiconductor layer 609g that will be a pixel TFT's active region and a storage capacitor, respectively. Meanwhile, the other regions are never doped with the phosphorus ions 612 lightly.

Subsequently, the doping masks 611n, 611p, 611g and 611d are removed and then gate electrodes 614n and 614p are formed on the semiconductor layers 609n and 609p and two gate electrodes 614g and an upper electrode 614s for a storage capacitor section are formed on the semiconductor layer 609g as shown in FIG. 13(F). Thereafter, a photoresist mask 615 is defined to cover the TFD's semiconductor layer 609d entirely.

The gate electrode 614n is arranged to cover a portion of the semiconductor layer 609n to be a channel region and to partially overlap with the n-type light doped regions 613n on the right- and left-hand sides of that channel region-to-be. The gate electrode 614p is arranged to cover a portion of the semiconductor layer 609p to be channel region. And the gate electrodes 614g are arranged to cover two portions of the semiconductor layer 609g to be respective channel regions.

In such a state, the semiconductor layers 609n, 609p and 609g are lightly doped with a second n-type dopant (phosphorus) 616. In this process step, phosphine (PH$_3$) is used as a doping gas, the acceleration voltage is set within the range of 60 to 90 kV (e.g., 70 kV), and the dose is set within the range of $1\times10^{12}$ to $1\times10^{14}$ cm$^{-2}$ (e.g., $2\times10^{13}$ cm$^{-2}$). As a result, a second set of n-type lightly doped regions 617n, 617p and 617g are defined in those portions of the semiconductor layers 609n, 609p and 609g that are not covered with the gate electrodes 614n, 614p and 614g and the upper electrode 614s.

Figure 14:
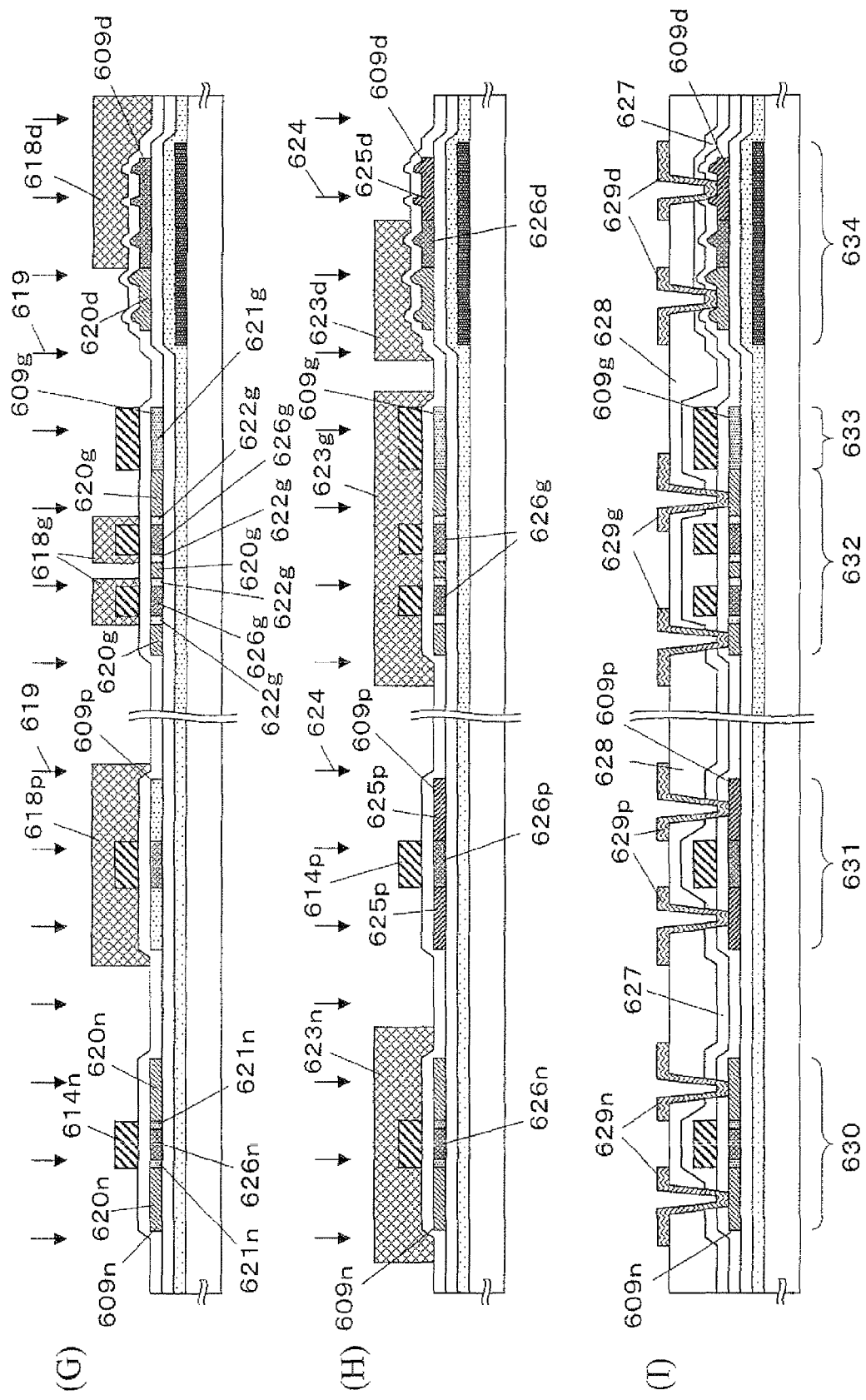
FIGS. 14(G) through 14(I) are schematic cross-sectional views illustrating respective manufacturing process steps to fabricate a semiconductor device according to a sixth preferred embodiment of the present invention.

Next, the photoresist mask 615 is stripped and then another set of photoresist masks 618p, 618g and 618d are defined on the semiconductor layers 609p, 609g and 609d, respectively, as shown in FIG. 14(G). The photoresist mask 618p is arranged to cover the semiconductor layer 609p entirely. The photoresist mask 618g is arranged to cover not only the gate electrodes 614g on the semiconductor layer 609g but also portions of the n-type lightly doped regions 617g of the second set that are located at both ends of each of the two gate electrodes 614g. And the photoresist mask 618d is arranged to cover the semiconductor layer 609d entirely except its portion to be an n-type region.

In such a state, the exposed portions are heavily doped with an n-type dopant (phosphorus) 619. In this process step, phosphine (PH$_3$) is used as a doping gas, the acceleration voltage is set within the range of 60 to 90 kV (e.g., 70 kV), and the dose is set within the range of $1\times10^{15}$ to $1\times10^{16}$ cm$^{-2}$ (e.g., $5\times10^{15}$ cm$^{-2}$). As a result, the exposed portions of the semiconductor layer 609n to be an n-channel TFT's active region, which are not covered with the gate electrode 614n, turn into source/drain regions 620n. Parts of the n-type lightly doped region of the second set, which were covered with the gate electrode 614n and not implanted with the phosphorus ions 619, become GOLD regions 621n. And the other part between the GOLD regions 621n, which was implanted with neither phosphorus nor boron, becomes a channel region 626n. Meanwhile, the semiconductor layer 609p to be a p-channel TFT's active region is not implanted with the phosphorus ions 619. On the other hand, the exposed portions of the semiconductor layer 609g to be a pixel TFT's active region and a storage capacitor, which are not covered with the photoresist mask 618g and which have been heavily doped with the phosphorus ions 619, turn into source/drain regions 620g. Parts of the n-type lightly doped region of the second set, which are covered with the photoresist mask 618g and not implanted with the phosphorus ions 619, become LDD regions 622g. Furthermore, portions of the semiconductor layer 609g, which are covered with the gate electrodes 614g, become channel regions 626g. Another portion of the semiconductor layer 609g covered with the upper electrode 614s remains the n-type lightly doped region of the first set and will be a lower electrode 621g for the storage capacitor. Furthermore, a exposed portion of the semiconductor layer 609d to be a TFD's active region, which is not covered with the photoresist mask 618d, becomes an n-type region 620d.

In this description, LDD regions overlapped by a gate electrode will be referred to herein as "GOLD regions" so as to be distinguished easily from LDD regions that are not overlapped (i.e., are offset) by a gate electrode (which will be simply referred to herein as "LDD regions").

Next, the photoresist masks 618p, 618g and 618d are stripped and then another set of photoresist masks 623n, 623g and 623d are defined on the semiconductor layers 609n, 609g and 609d, respectively, as shown in FIG. 14(H). The photoresist masks 623n and 623g are arranged to cover the semiconductor layers 609n and 609g entirely. The photoresist mask 623d is arranged to cover the semiconductor layer 609d entirely except its portion to be a p-type region.

In such a state, the exposed portions are heavily doped with a p-type dopant (boron) 624. In this process step, diborane (B$_2$H$_6$) is used as a doping gas, the acceleration voltage is set within the range of 40 to 90 kV (e.g., 75 kV), and the dose is set within the range of $1\times10^{15}$ to $1\times10^{16}$ cm$^{-2}$ (e.g., $3\times10^{15}$ cm$^{-2}$). As a result, the exposed portions of the semiconductor layer 609p to be a p-channel TFT's active region, which are not covered with the gate electrode 614p, turn into source/drain regions 625p. On the other hand, the other portion of the semiconductor layer 609p, which is covered with the gate electrode 614p and which has not been implanted with the boron ions 624, becomes a channel region 626p. The semiconductor layers 609n and 609g are not implanted with the boron ions 624 heavily. But a portion of the TFD's semiconductor layer 609d is heavily implanted with the boron ions 624 and becomes a p-type region 625d. And another portion of the semiconductor layer 609d that has been implanted with neither phosphorus nor boron becomes an intrinsic region 626d.

Next, the photoresist masks 623n, 623g and 623d are removed and then a heat treatment is carried out to activate the dopants (i.e., phosphorus and boron) that have been implanted into the respective semiconductor layers. This activation process may be performed in the same way and on the same condition as already described for the first preferred embodiment with reference to FIG. 3(G).

Subsequently, as shown in FIG. 14(I), a silicon nitride film 627 and a silicon dioxide film 628 are deposited in this order as interlevel dielectric films. If necessary, a heat treatment process may be conducted for the purpose of hydrogenation. After that, contact holes are cut through the interlevel dielectric films 627 and 628 and electrodes and interconnects 629n, 629p, 629g and 629d are formed just as already described with reference to FIG. 3(H).

In this manner, an n-channel thin-film transistor 630, a p-channel thin-film transistor 631, a pixel switching thin-film transistor 632, a storage capacitor 633 and a thin-film diode 634 are completed. Optionally, contact holes may also be cut over the respective gate electrodes of these thin-film transistors 630 and 631 that form a circuit, thereby connecting those transistors 630 and 631 to the source/drain regions of other TFTs on the substrate through source/drain interconnects. Also, if necessary, these components could be covered with a passivation film, too.

According to this preferred embodiment, the semiconductor layer of the thin-film diode 634 can have a greater surface roughness than the respective semiconductor layers of the thin-film transistors 630 to 632 as in the preferred embodiments described above. Consequently, the thin-film diode 634 comes to have increased sensitivity to light and an increased SNR. And the thin-film transistors 630 to 632 can have increased reliability and increased field effect mobility.

On top of that, since the semiconductor layer to be the lower electrode 621g of the storage capacitor 633 has its surface roughness minimized, the breakdown voltage of the capacitor section can be increased. As a result, the rate of failure caused by leakage current flowing through the capacitor can be reduced significantly.

What's more, the respective semiconductor layers can have different surface roughnesses only with their degrees of crystallinity kept substantially equal to each other, the respective device performances of the thin-film transistors 630 to 632 and the thin-film diode 634 can be optimized according to their applications.

The surface roughness values of the semiconductor layers 609n, 609n, 609g and 609d of this preferred embodiment are not particularly limited. For example, if these semiconductor layers are formed out of an amorphous silicon film with a thickness of 50 nm, the semiconductor layers 609n, 609p, and 609g to define the active regions of TFTs and capacitor section may have an arithmetic average roughness Ra of 1-3 nm and a maximum height Rz of 10-20 nm. On the other hand, the semiconductor layer 609d to define the active region of a TFD may have an arithmetic average roughness Ra of 6-10 nm and a maximum height Rz of 60 to 100 nm. If the semiconductor layers have surface roughness values falling within these ranges, the photosensitivity (as represented by a bright current value) of the thin-film diode 634 that has been formed out of the semiconductor layer 609d will be approximately 1.5 times as high as that of a thin-film diode, of which the surface roughness of the semiconductor layer is as high as that of the thin-film transistors 630 to 632.

It is preferred that the doping process step to define source/drain regions for the thin-film transistors 630 to 632 and the doping process step to define an n-type or p-type region for the thin-film diode 634 be performed at the same time as in the process described above because the manufacturing process can be further simplified in that case. Particularly if the n-channel and p-channel thin-film transistors 630 and 631 are formed at the same time as in the preferred embodiment described above (i.e., to form TFTs with a CMOS arrangement), then the process step of introducing an n-type dopant to make the thin-film diode 634 and the thin-film transistor 630 and the process step of introducing a p-type dopant to make the thin-film diode 634 and the thin-film transistor 631 can be performed at the same time, which is even more beneficial.

Embodiment 7

Hereinafter, a display device with a sensor function will be described as a seventh specific preferred embodiment of the present invention. Such a display device is fabricated by using semiconductor devices according to any of the preferred embodiments of the present invention described above.

A display device with a sensor function according to this preferred embodiment may be a liquid crystal display device with a touchscreen sensor, which includes a display area and a frame area surrounding the display area. The display area includes a plurality of display units (i.e., pixels) and a plurality of photosensor units. Each display unit includes a pixel electrode and a pixel switching TFT. Each photosensor unit includes a TFD. The frame area has a display driver to drive the respective display units, and driver TFTs are used to form the driver. The pixel switching TFTs, the driver TFTs and the photosensor unit TFDs have been integrated together on the same substrate by the method of any of the first through sixth preferred embodiments of the present invention described above. It should be noted that among those TFTs for use in the display device of the present invention, at least the pixel switching TFTs and the photosensor unit TFDs should be formed on the same substrate by the method described above. Thus, the driver, for example, may be arranged on another substrate.

According to this preferred embodiment, each photosensor unit is arranged adjacent to its associated display unit (e.g., a pixel representing a primary color). In this case, either a single photosensor unit or multiple photosensor units may be provided for a single display unit. Alternatively, one photosensor unit may be provided for a set of multiple display units. For example, one photosensor unit may be provided for a set of three color display pixels, which may be pixels representing the three primary colors of R, G and B. In this manner, the number (or the density) of photosensor units with respect to that of display units may be appropriately selected according to the resolution.

If color filters were arranged closer to the viewer than the photosensor units are, then the sensitivity of the TFDs that form the photosensor units might decrease. That is why it is preferred that no color filters be arranged closer to the viewer than the photosensor units are.

It should be noted that the display device of this preferred embodiment does not have to have the configuration described above. For example, if the photosensor TFDs are arranged in the frame area, the display device can also function as an ambient light sensor that can control the screen brightness according to the illuminance of the external light. Alternatively, if color filters are arranged closer to the viewer than the photosensor units are so that the incoming light is transmitted through the color filters and then received at the photosensor units, the photosensor units can function as a color image sensor.

Hereinafter, a display device according to this preferred embodiment will be described with reference to the accompanying drawings as being applied to a touchscreen panel LCD with a touchscreen panel sensor.

Figure 15:
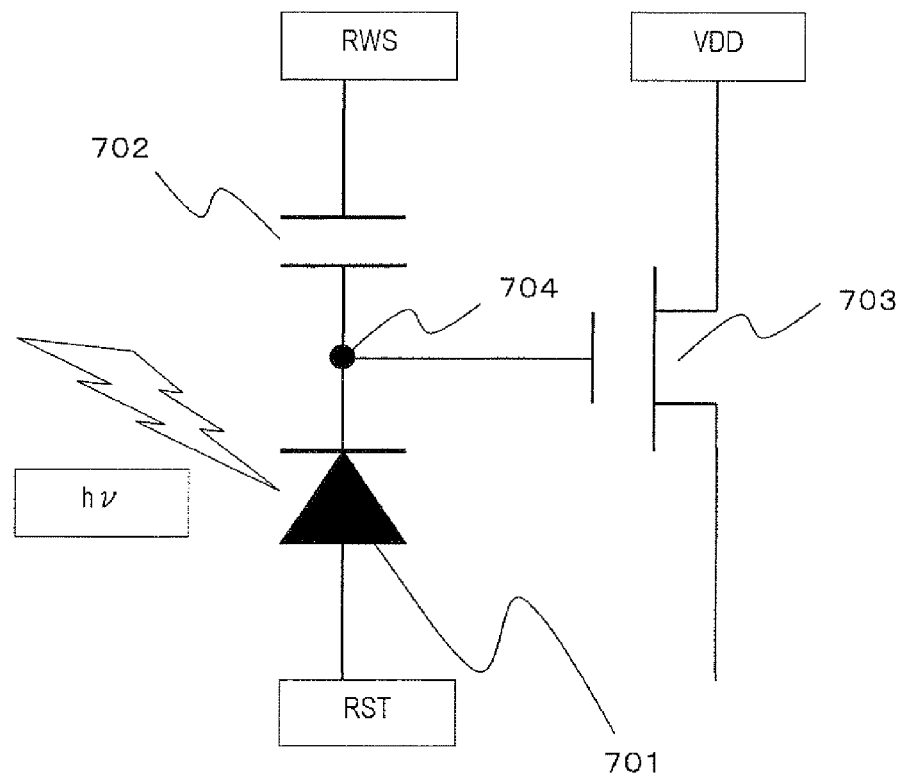
FIG. 15 is a circuit diagram illustrating a photosensor TFD according to a seventh preferred embodiment of the present invention.

FIG. 15 is a circuit diagram illustrating a configuration for a photosensor unit to be arranged in the display area. The photosensor unit includes a photosensor thin-film diode 701, a signal storage capacitor 702, and a thin-film transistor 703 for retrieving the signal stored in the capacitor 702. After an RST signal has been received and after an RST potential has been written at a node 704, the potential at the node 704 decreases due to the leakage current produced by the incoming light. Then, the gate potential of the thin-film transistor 703 varies to open or close the TFT gate. In this manner, a signal VDD can be retrieved.

Figure 16:
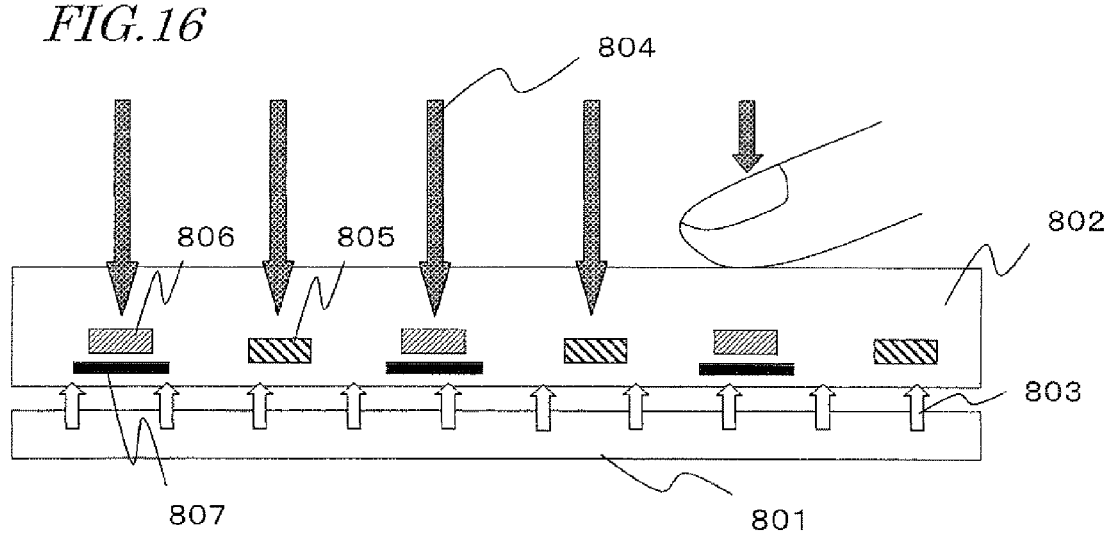
FIG. 16 illustrates a configuration for a photosensing type touchscreen panel according to the seventh preferred embodiment of the present invention.

FIG. 16 is a schematic cross-sectional view illustrating an example of an active-matrix-addressed touchscreen panel LCD. In this example, an optical touchscreen sensor section including a photosensor unit is provided for each pixel.

The LCD shown in FIG. 16 includes a liquid crystal module 802 and a backlight 801, which is arranged behind the liquid crystal module 802. Although not shown in FIG. 16, the liquid crystal module 802 includes a light transmissive rear substrate, a front substrate that is arranged to face the rear substrate, and a liquid crystal layer interposed between those two substrates. The liquid crystal module 802 includes a number of display units (i.e., pixels representing the primary colors), each of which includes a pixel electrode (not shown) and a pixel switching thin-film transistor 805 that is connected to the pixel electrode. Also arranged adjacent to each display unit is an optical touchscreen sensor unit including a thin-film diode 806. Although not shown in FIG. 16, either, color filters are arranged closer to the viewer over each display unit but not over any optical touchscreen sensor unit. An opaque layer 807 is arranged between the thin-film diodes 806 and the backlight 801. Thus, the light that has come from the backlight 801 is cut off by the opaque layer 807 and not incident on any thin-film diode 806, which is supposed to be struck by only external light 804. By getting this incoming external light 804 sensed by the thin-film diodes 806, a photosensing type touchscreen panel is realized. It should be noted that the opaque layer 807 has only to be arranged so that the light that has come from the backlight 801 does not enter the intrinsic region of any thin-film diode 806.

Figure 17:
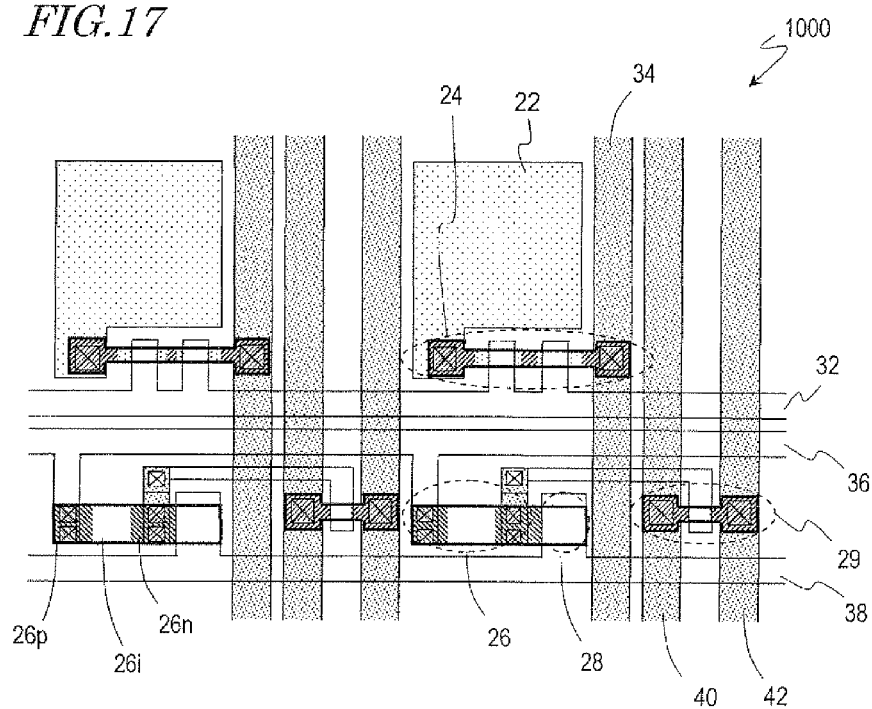
FIG. 17 is a plan view schematically illustrating the rear substrate of a touchscreen panel LCD according to the seventh preferred embodiment of the present invention.

FIG. 17 is a schematic plan view illustrating an exemplary rear substrate for use in the active-matrix-addressed touchscreen panel LCD. The LCD of this preferred embodiment is actually made up of a huge number of pixels (including R, G and B pixels). But only two of those pixels are shown in FIG. 17 for the sake of simplicity.

The rear substrate 1000 includes a number of display units (i.e., pixels), each including a pixel electrode 22 and a pixel switching thin-film transistor 24, and a number of optical touchscreen sensor units, each of which is arranged adjacent to an associated one of the display units and which includes a photosensor photodiode 26, a signal storage capacitor 28, and a photosensor follower thin-film transistor 29.

The thin-film transistor 24 may have the same structure as the TFT that has already been described for the third preferred embodiment, i.e., a dual-gate LDD structure including two gate electrodes and an LDD region. The thin-film transistor 24 has its source region connected to a pixel source bus line 34 and has its drain region connected to the pixel electrode 22. The thin-film transistor 24 is turned ON and OFF in response to a signal supplied through a pixel gate bus line 32. With such an arrangement, the pixel electrode 22 and a counter electrode on the front substrate that is arranged to face the rear substrate 1000 apply a voltage to the liquid crystal layer, thereby varying the orientation state of the liquid crystal layer and getting a display operation done.

On the other hand, the photosensor photodiode 26 may have the same configuration as the TFD that has already been described for the third preferred embodiment, and has a $p^+$-type region 26$p$, an $n^+$-type region 26$n$ and an intrinsic region 26$i$ arranged between these two regions 26$p$ and 26$n$. The signal storage capacitor 28 uses a gate electrode layer and an Si layer as electrodes, and forms capacitance in its gate insulating film. The photosensor photodiode 26 has its $p^+$-type region 26$p$ connected to a photosensor RST signal line and has its $n^+$-type region 26$n$ connected to the lower electrode (Si layer) of the signal storage capacitor 28 and to a photosensor RWS signal line 38 by way of the capacitor 28. The $n^+$-type region 26$n$ is further connected to the gate electrode layer of the photosensor follower thin-film transistor 29, of which the source and drain regions are connected to a photosensor VDD signal line 40 and a photosensor COL signal line 42, respectively.

As described above, the photosensor photodiode 26, the signal storage capacitor 28, and the photosensor follower thin-film transistor 29 respectively correspond to the thin-film diode 701, capacitor 702 and thin-film transistor 703 of the driver shown in FIG. 15 and together form a photosensor driver. Hereinafter, it will be described how this driver performs a photosensing operation.

(1) First of all, through the RWS signal line 38, a RWS signal is written on the signal storage capacitor 28. As a result, a positive electric field is generated in the $n^+$-type region 26$n$ of the photosensor photodiode 26 and a reverse bias will be applied to the photosensor photodiode 26. (2) Next, photo-leakage current is produced in the photosensor photodiodes 26 in a surface region of the substrate that is irradiated with light, thus moving the electrical charges toward the RST signal line 36. (3) As a result, the potential decreases in the $n^+$-type region 26$n$ and that potential variation in turn causes a variation in the gate voltage applied to the photosensor follower thin-film transistor 29. (4) A VDD signal is supplied through the VDD signal line 40 to the source electrode of the photosensor follower thin-film transistor 29. When the gate voltage varies as described above, the amount of the current flowing through the COL signal line 42 that is connected to the drain electrode changes. Thus, the electrical signal representing that current can be output through the COL signal line 42. (5) And through the COL signal line 42, an RST signal is written on the photosensor photodiode 26, thereby resetting the potential at the signal storage capacitor 28. By performing this series of processing steps (1) through (5) a number of times while getting scanning done, photosensing can be carried out.

In the touchscreen panel LCD of this preferred embodiment, the rear substrate does not always have to have the configuration shown in FIG. 17. Optionally, a storage capacitor Cs may be provided for each pixel switching TFT, for example. In the example illustrated in FIG. 17, an optical touchscreen sensor unit is arranged adjacent to each of the R, G and B pixels. Alternatively, one optical touchscreen sensor unit may be provided for a set of three color display pixels (i.e., R, G and B pixels) just as described above.

Now take a look at FIG. 16 again. In the example described above, the thin-film diodes 806 are arranged in the display area and used as a touchscreen sensor as can be seen from the cross-sectional view illustrated in FIG. 16. Alternatively, the thin-film diodes 806 may also be arranged outside of the display area and may be used as an ambient light sensor for controlling the luminance of the backlight 801 according to the illuminance of the external light 804.

Figure 18:
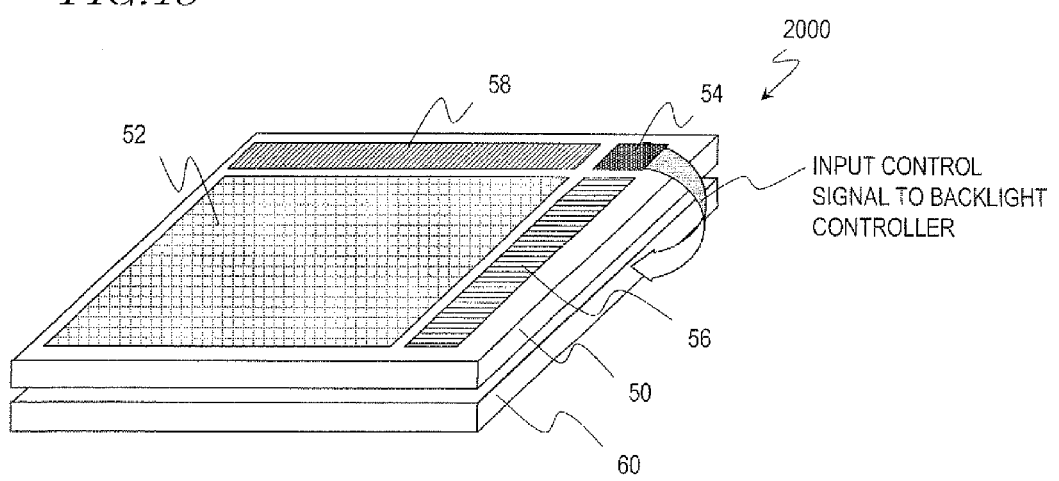
FIG. 18 is a perspective view illustrating a liquid crystal display device with an ambient light sensor according to the seventh preferred embodiment of the present invention.

FIG. 18 is a perspective view illustrating an LCD with an ambient light sensor. The LCD 2000 includes an LCD substrate 50 including a display area 52, a gate driver 56, a source driver 58 and a photosensor section 54, and a backlight 60, which is arranged behind the LCD substrate 50. A portion of the LCD substrate 50, which surrounds the display area 52 and which includes the drivers 56 and 58 and the photosensor section 54, will be referred to herein as a "frame area".

The luminance of the backlight 60 is controlled by a backlight controller (not shown). Although not shown, the display area 52 and the drivers 56 and 58 use TFTs and the photosensor section 54 uses TFDs. The photosensor section 54 generates an illuminance signal representing the illuminance of the external light and enters it into the backlight controller using connection with a flexible substrate. In response to the illuminance signal, the backlight controller generates a backlight control signal and outputs it to the backlight 60.

Optionally, by applying the present invention, an organic EL display device with an ambient light sensor can also be provided. Such an organic EL display device may also have a configuration including display units and photosensor units on the same substrate just like the LCD shown in FIG. 18 but does not need to have the backlight 60 behind the substrate. In that case, the photosensor section 54 is connected to the source driver 58 with a cable provided for the substrate 50 so that the illuminance signal is supplied from the photosensor section 54 to the source driver 58. In response to that illuminance signal, the source driver 58 adjusts the luminance of the display area 52.

While the present invention has been described with respect to specific preferred embodiments thereof, it will be apparent to those skilled in the art that the disclosed invention may be modified in numerous ways and may assume many embodiments other than those specifically described above as long as those modifications fall within the true spirit and scope of the invention. For example, by using the TFTs of the present invention, analog drivers and digital drivers may be fabricated on a glass substrate at the same time. Such an analog driver may include a source driver, a pixel section and a gate driver. The source driver may include a shift register, a buffer and a sampling circuit (transfer gate). On the other hand, the gate driver may include a shift register, a level shifter and a buffer. Also, if necessary, a level shifter circuit may be provided between the sampling circuit and the shift register. Furthermore, according to the manufacturing process of the present invention, a memory and a microprocessor may also be fabricated.

The present invention provides a semiconductor device including high-performance TFTs and TFDs that have been fabricated on the same substrate using their best semiconductor films. As a result, TFTs with high field effect mobility and ON/OFF ratio, which can be used as driver TFTs and pixel electrode switching TFTs, and TFDs that will have a low dark current value when used as photosensors and a high SNR with respect to the incoming light (i.e., a high bright current to dark current ratio), can be fabricated by performing the same series of manufacturing processing steps. Among these semiconductor layers, if their portions to be the channel region that will have significant influence on the field effect mobility of TFTs and the intrinsic region that will have great impact on the photosensitivity of TFDs are optimized in terms of their surface unevenness, the respective semiconductor components can achieve their best device performances required. Furthermore, such high-performance semiconductor components are provided by performing a simple manufacturing process, and a product of a smaller size and with improved performance can be provided at a reduced cost.

INDUSTRIAL APPLICABILITY

The present invention has a broad variety of applications and is applicable to any kind of semiconductor device with TFTs and TFDs and to an electronic device in any field that uses such a semiconductor device. For example, a CMOS circuit and a pixel section fabricated by carrying out the present invention may be used in an active-matrix-addressed liquid crystal display device and an organic EL display device. Such a display device may be used as either the display screen of a cellphone or a portable game console or the monitor of a digital camera. Consequently, the present invention is applicable to any kind of electronic device including a built-in LCD or organic EL display device.

The present invention can be used particularly effectively in a display device such as an active-matrix-addressed LCD an organic EL display device, an image sensor, a photosensor, and an electronic device including any of these devices in combination. It would be particularly beneficial to apply the present invention to a display device with a photosensor function that uses TFDs or an electronic device with such a display device. Optionally, the present invention is also applicable to an image sensor including a photosensor that uses a TFD and a driver that uses a TFT.

REFERENCE SIGNS LIST 101 substrate
102 opaque layer
103, 104 undercoat film
105 amorphous silicon film
105a, 105b portion (crystallized region) of crystalline silicon film
108, 109 semiconductor island
110 gate insulating film
111 gate electrode
112, 117 mask
113 n-type dopant (phosphorus)
114 source/drain regions
115 $n^+$ region
116 channel region
118 p-type dopant (boron)
119 $p^+$ region
120 intrinsic region
121, 122 interlevel dielectric film
123 thin-film transistor's electrodes and interconnects
124 thin-film diode's electrodes and interconnects
125 thin-film transistor
126 thin-film diode

The invention claimed is:

1. A method for fabricating a semiconductor device, the method comprising the steps of:
   (a1) providing a substrate, of which the surface is already covered with an amorphous semiconductor film;
   (b) forming an oxide layer on a portion of the amorphous semiconductor film;
   (c) irradiating and crystallizing the amorphous semiconductor film with a laser beam that has come from over the oxide layer, thereby obtaining a crystalline semiconductor film including a first crystallized region, in which the rest of the amorphous semiconductor film that is not covered with the oxide layer has been crystallized, and a second crystallized region, in which the portion of the amorphous semiconductor film that is covered with the oxide layer has been crystallized and which has a greater surface roughness than the first crystallized region; and
   (d) patterning the crystalline semiconductor film into a first semiconductor island to define the active region of a thin-film transistor and a second semiconductor island to define the active region of a thin-film diode, the first semiconductor island having the first crystallized region, the second semiconductor island having the second crystallized region.

2. A method for fabricating a semiconductor device, the method comprising the steps of:
   (a1) providing a substrate, of which the surface is already covered with an amorphous semiconductor film;
   (a2) irradiating the amorphous semiconductor film with a laser beam, thereby crystallizing and turning the amorphous semiconductor film into a crystalline semiconductor film;
   (b) forming an oxide layer locally on the crystalline semiconductor film;
   (c) irradiating the crystalline semiconductor film with a laser beam that has come from over the oxide layer and reducing the surface roughness of a part of the crystalline semiconductor film that is not covered with the oxide layer, thereby turning that part of the crystalline semiconductor film that is not covered with the oxide layer into a first crystallized region and the rest of the crystalline semiconductor film that is covered with the oxide layer into a second crystallized region with a greater surface roughness than the first crystallized region; and (d) patterning the crystalline semiconductor film into a first semiconductor island to define the active region of a thin-film transistor and a second semiconductor island to define the active region of a thin-film diode, the first semiconductor island having the first crystallized region, the second semiconductor island having the second crystallized region.

3. A method for fabricating a semiconductor device, the method comprising the steps of:

(a1) providing a substrate, of which the surface is already covered with an amorphous semiconductor film;

(a2') adding a catalyst element that promotes crystallization to at least a part of the amorphous semiconductor film and then heating the amorphous semiconductor film, thereby crystallizing and turning the amorphous semiconductor film into a crystalline semiconductor film;

(b) forming an oxide layer locally on the crystalline semiconductor film;

(c) irradiating the crystalline semiconductor film with a laser beam that has come from over the oxide layer, thereby further crystallizing or re-crystallizing and turning a part of the crystalline semiconductor film that is not covered with the oxide layer into a first crystallized region and the rest of the crystalline semiconductor film that is covered with the oxide layer into a second crystallized region with a greater surface roughness than the first crystallized region; and (d) patterning the crystalline semiconductor film into a first semiconductor island to define the active region of a thin-film transistor and a second semiconductor island to define the active region of a thin-film diode, the first semiconductor island having the first crystallized region, the second semiconductor island having the second crystallized region.

4. A method for fabricating a semiconductor device, the method comprising the steps of:

(a1) providing a substrate, of which the surface is already covered with an amorphous semiconductor film;

(a2') adding a catalyst element that promotes crystallization to at least a part of the amorphous semiconductor film and then heating the amorphous semiconductor film, thereby crystallizing and turning the amorphous semiconductor film into a crystalline semiconductor film;

(a3') irradiating and farther crystallizing or re-crystallizing the crystalline semiconductor film with a laser beam;

(b) forming an oxide layer locally on the crystalline semiconductor film;

(c) irradiating the crystalline semiconductor film with a laser beam that has come from over the oxide layer and reducing the surface roughness of a part of the crystalline semiconductor film that is not covered with the oxide layer, thereby turning that part of the crystalline semiconductor film that is not covered with the oxide layer into a first crystallized region and the rest of the crystalline semiconductor film that is covered with the oxide layer into a second crystallized region with a greater surface roughness than the first crystallized region; and (d) patterning the crystalline semiconductor film into a first semiconductor island to define the active region of a thin-film transistor and a second semiconductor island to define the active region of a thin-film diode, the first semiconductor island having the first crystallized region, the second semiconductor island having the second crystallized region.

5. The method of claim 1, further comprising the step of removing a natural oxide film from that part of the amorphous semiconductor film that is not covered with the oxide layer before the step (c).

6. The method of claim 1, wherein the step (c) is performed within an inert gas atmosphere such as a nitrogen gas ambient.

7. The method of claim 1, wherein the substrate is light transmissive, and wherein the step (a1) includes the steps of:

forming an opaque layer for cutting light that has come from under the opposite surface of the substrate on a region of the substrate, which will be located under the second semiconductor island to be the active region of a thin-film diode; and depositing the amorphous semiconductor film over the substrate on which the opaque layer has been formed, and wherein the step (b) includes the steps of:

(b1) depositing an oxide film on either the amorphous semiconductor film or the crystalline semiconductor film;

(b2) depositing a photoresist film on the oxide film and subjecting the photoresist film to exposure and development processes, thereby forming a photoresist pattern; and (b3) etching the oxide film using the photoresist pattern as a mask, thereby forming the oxide layer, and wherein the step (b2) includes exposing the photoresist film to the light that has come from under the opposite surface of the substrate using the opaque layer as a mask.

8. The method of claim 1, wherein the step (b) includes setting the thickness D (nm) of the oxide layer so that the thickness D and the refractive index n of the oxide layer and the wavelength λ (nm) of the laser beam in the step (c) satisfy the inequality:

$$D \leq \lambda/(4 \times n) \times 0.5.$$

9. The method of claim 2, further comprising the step of thinly oxidizing the surface of the amorphous semiconductor film before the step (a2).

10. The method of claim 2, wherein the step (a2) is performed within an atmosphere including oxygen.

11. The method of claim 2, wherein the step (c) includes radiating the laser beam with such a radiation energy density that is not too high to avoid resetting completely the crystal state of the crystalline semiconductor film that has been obtained in the step (a2).

12. The method of claim 3, wherein the step (c) includes radiating the laser beam with such a radiation energy density that is not too high to avoid resetting completely the crystal state of the crystalline semiconductor film that has been obtained in the step (a2').

13. The method of claim 4, further comprising the step of thinly oxidizing the surface of the amorphous semiconductor film before the step (a3').

14. The method of claim 4, wherein the step (a3') is performed within an atmosphere including oxygen.

15. The method of claim 4, wherein the step (c) includes radiating the laser beam with such a radiation energy density that is not too high to avoid resetting completely the crystal state of the crystalline semiconductor film that has been obtained in the step (a3').

16. The method of claim 4, wherein the step (a3') includes radiating the laser beam with such a radiation energy density that is not too high to avoid resetting completely the crystal state of the crystalline semiconductor film that has been obtained in the step (a2').

17. The method of claim 3, wherein nickel is used as the catalyst element in the step (a2').

18. A display device comprising:
a display area including a plurality of display units; and
a frame area, which surrounds the display area,
wherein the device further includes a photosensor unit with a thin-film diode, and
wherein each said display unit includes an electrode and a thin-film transistor that is connected to the electrode, and
wherein the thin-film transistor and the thin-film diode have been formed on the same substrate, and
wherein the thin-film transistor includes a crystalline semiconductor layer with a channel region and source and drain regions, a gate insulating film that is arranged to cover the crystalline semiconductor layer, and a gate electrode that is arranged on the gate insulating film to control the conductivity of the channel region, and
wherein the thin-film diode includes a crystalline semiconductor layer that has at least an n-type region and a p-type region, and
wherein the respective semiconductor layers of the thin-film transistor and the thin-film diode are crystalline semiconductor layers that have been formed by crystallizing the same amorphous semiconductor film, and
wherein ridges have been formed on the surface of the semiconductor layer of the thin-film diode, and
wherein the semiconductor layer of the thin-film diode has a greater surface roughness than the semiconductor layer of the thin-film transistor.

19. The display device of claim 18, wherein the display unit further includes a backlight and a backlight controller for controlling the luminance of the light emitted from the backlight, and
wherein the photosensor unit generates an illuminance signal representing the illuminance of external light and outputs the illuminance signal to the backlight controller.

20. The display device of claim 18, further comprising multiple optical touchscreen sensors, each of which includes the photosensor unit and is arranged in the display area for associated one, two or more of the display units.

* * * * *